United States Patent
Ironside et al.

(10) Patent No.: US 12,235,587 B2
(45) Date of Patent: Feb. 25, 2025

(54) METHOD AND SYSTEM FOR DETERMINING INITIAL CONTACT CONTROL VALUES FOR SHAPING PARTIAL FIELDS AND METHOD AND SYSTEM FOR SHAPING PARTIAL FIELDS

(71) Applicant: CANON KABUSHIKI KAISHA, Tokyo (JP)

(72) Inventors: Daniel Ironside, Austin, TX (US); Logan L. Simpson, Coupland, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 36 days.

(21) Appl. No.: 18/127,074

(22) Filed: Mar. 28, 2023

(65) Prior Publication Data

US 2024/0329542 A1    Oct. 3, 2024

(51) Int. Cl.
*G03F 7/20* (2006.01)
*G03F 7/00* (2006.01)

(52) U.S. Cl.
CPC ............................. *G03F 7/70516* (2013.01)

(58) Field of Classification Search
CPC . B29C 43/56; B29C 2043/563; G03F 7/0002; G03F 7/161; G03F 7/70516; H01L 21/28123
See application file for complete search history.

(56) References Cited

U.S. PATENT DOCUMENTS

| | | |
|---|---|---|
| 6,936,194 B2 | 8/2005 | Watts |
| 7,157,036 B2 | 1/2007 | Choi et al. |
| 8,066,930 B2 | 11/2011 | Sreenivasan |
| 8,076,386 B2 | 12/2011 | Xu et al. |
| 8,349,241 B2 | 1/2013 | Sreenivasan et al. |
| 8,865,046 B2 | 10/2014 | Sreenivasan et al. |
| 9,285,675 B2 | 3/2016 | Hamaya et al. |
| 9,400,426 B2 | 7/2016 | Hamaya et al. |
| 10,578,964 B2 | 3/2020 | Ganapathisubramanian et al. |
| 10,870,225 B2 | 12/2020 | Harayama |
| 11,104,057 B2 | 8/2021 | Meissl et al. |
| 11,187,979 B2 | 11/2021 | Yoshida et al. |
| 11,614,693 B2 | 3/2023 | Lu et al. |
| 2010/0096764 A1 | 4/2010 | Lu |
| 2013/0113136 A1 | 5/2013 | Arai |
| 2019/0101823 A1 | 4/2019 | Patel et al. |
| 2021/0132516 A1* | 5/2021 | Iino ........................ B29C 35/08 |

FOREIGN PATENT DOCUMENTS

JP    2016-039182 A    3/2016

* cited by examiner

*Primary Examiner* — Mesfin T Asfaw
(74) *Attorney, Agent, or Firm* — Daniel Ratoff

(57) ABSTRACT

A system and method for shaping a film on a partial field which may include determining a set of initial contact control values based on: a superset of calibration data; a desired initial contact point; and a partial field shape description. The system and Method may also include imprinting the partial field with the set of initial contact control values.

18 Claims, 13 Drawing Sheets

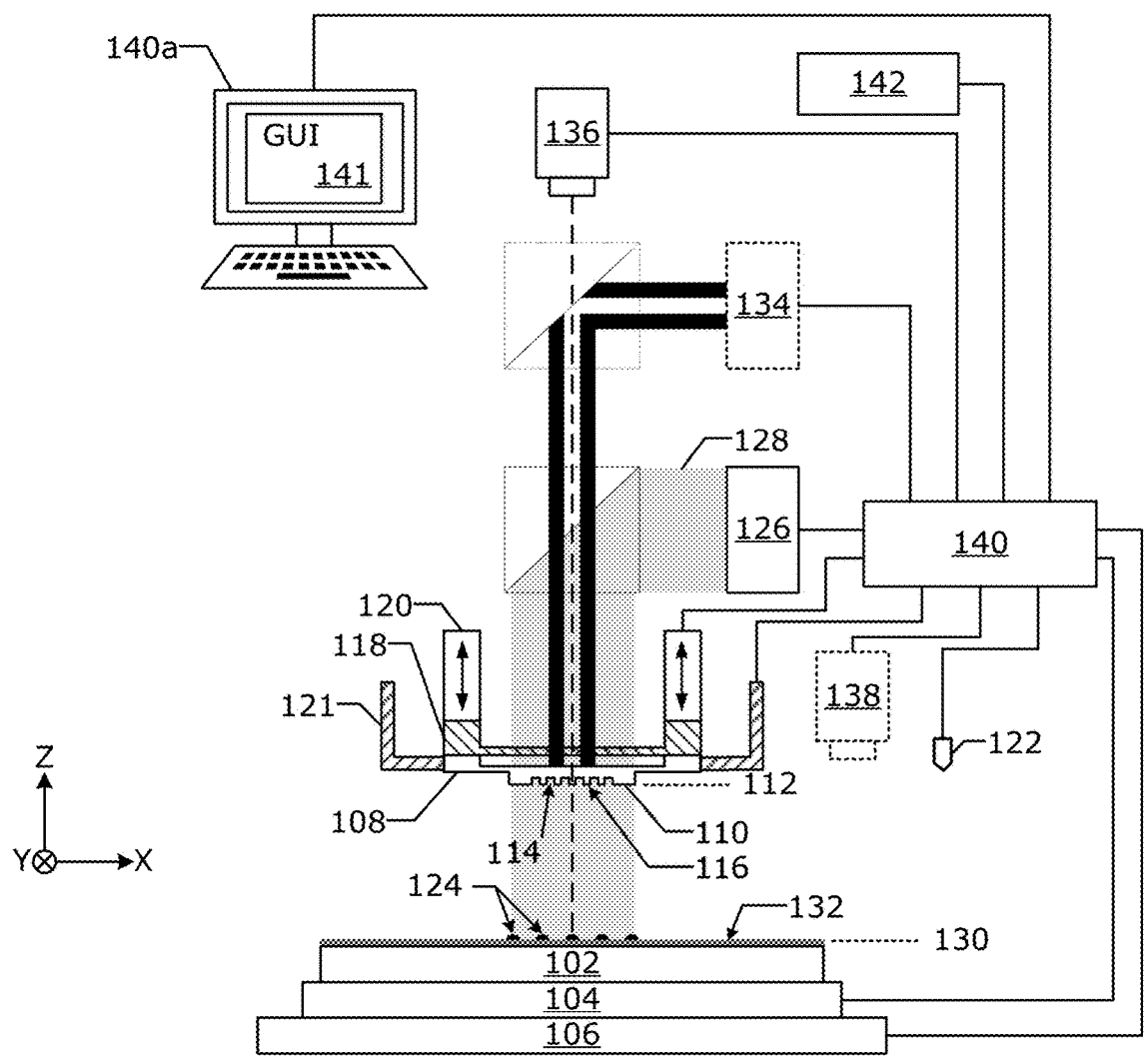
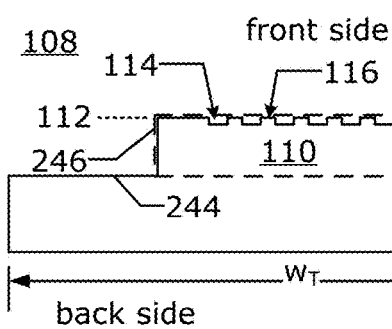
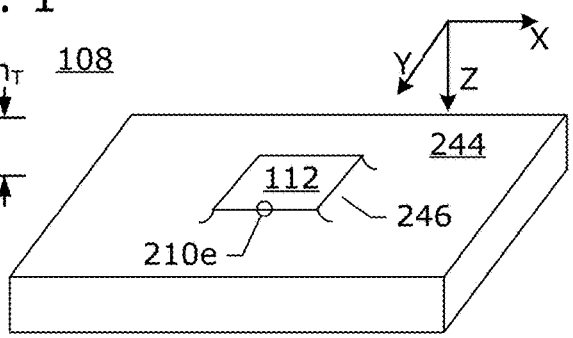
FIG. 1
FIG. 2A
FIG. 2B

METHOD AND SYSTEM FOR DETERMINING INITIAL CONTACT CONTROL VALUES FOR SHAPING PARTIAL FIELDS AND METHOD AND SYSTEM FOR SHAPING PARTIAL FIELDS

BACKGROUND OF INVENTION

Technical Field

The present disclosure relates to photomechanical shaping systems (e.g., Nanoimprint Lithography and Inkjet Adaptive Planarization). In particular, the present disclosure relates to methods of determining control values for shaping a partial field and a novel method of contacting a substrate with a shaping surface.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The shaping process uses a template spaced apart from the substrate. The formable liquid is applied onto the substrate. The template is brought into contact with the formable liquid that may have been deposited as a drop pattern using the formable liquid to spread and fill the space between the template and the substrate. The formable liquid is solidified to form a film that has a shape (pattern) conforming to a shaping surface of the template. After solidification, the template is separated from the solidified layer such that the template and the substrate are spaced apart.

The substrate and the solidified layer may then be subjected to known steps and processes for device (article) fabrication, including, for example, curing, oxidation, layer formation, deposition, doping, planarization, etching, formable material removal, dicing, bonding, and packaging, and the like. For example, the pattern on the solidified layer may be subjected to an etching process that transfers the pattern into the substrate.

SUMMARY OF THE INVENTION

A first embodiment, may be a method imprinting a partial field. The method may comprise determining a set of initial contact control values based on: a superset of calibration data; a desired initial contact point; and a partial field shape description. The method may further include imprinting the partial field with the set of initial contact control values.

In an aspect of the first embodiment the set of initial contact control values may comprise: a template cavity pressure applied to a portion of a template during initial contact of the template with formable material on a substrate; a substrate pressure applied to a portion of the substrate during initial contact of the template with formable material on the substrate; and a tilt of the template relative to the substrate during initial contact of the template with formable material on the substrate.

In an aspect of the first embodiment each element of the superset of calibration data may be a set that includes: a test set of initial contact control values; a measured initial contact point; and a test partial field shape description.

The first embodiment, may further comprise generating the calibration data. Generating the calibration data may comprise: imprinting a plurality of test partial fields each test partial field among the plurality of partial fields having: a measured initial contact point of the each test partial field; a test partial field shape description; and the set of initial contact control values of the each test partial field.

The first embodiment, may further comprise receiving an image of a template initially contacting formable material on a substrate; measuring interference fringes in the image; and estimating a center of the interference fringes as the measured initial contact point.

In an aspect of the first embodiment the partial field shape description may comprise: an azimuthal position of the partial field; and an area of the partial field.

In an aspect of the first embodiment the partial field shape description may further comprise a partial field category that is based on a shape of the partial field.

In an aspect of the first embodiment the determining of the set of initial contact control values may comprise: identifying a subset of the superset of calibration data that surround the partial field shape description and the desired initial contact point; selecting a first potential set of initial contact control values within a control value range defined by the subset of the superset of calibration data; and predicting a first potential initial contact point using an initial contact point model and the first potential set of initial contact control values.

In an aspect of the first embodiment the determining of the set of initial contact control values may further comprise: estimating a first potential contact point difference between the first potential initial contact point and the desired initial contact point; and setting the first potential set of initial control values as the set of initial contact control values in a case wherein the first potential contact point difference in within a contact threshold.

In an aspect of the first embodiment determining of the set of initial contact control values may further comprise: recursively selecting a new potential set of initial contact control values within the control value range defined by the subset of the superset of calibration data; recursively predicting a new potential initial contact point using the initial contact point model and the new potential set of initial contact control values; recursively estimating a new potential contact point difference between the new potential initial contact point and the desired initial contact point; wherein the recursively selecting, recursively predicting, and recursively estimating are recursively performed until the new potential contact point difference is within the contact threshold; and setting the new potential set of initial control values as the set of initial contact control values once the first potential contact point difference in within the contact threshold.

In an aspect of the first embodiment determining of the set of initial contact control values may comprise: identifying a subset of the superset of calibration data that surround the partial field shape description and the desired initial contact point; selecting a plurality of potential sets of initial contact control values within a control value range defined by the subset of the superset of calibration data; predicting a plurality of potential initial contact points using an initial contact point model and the plurality of potential sets of initial contact control values; estimating a plurality of potential contact point differences between the plurality of potential initial contact points and the desired initial contact point; selecting a potential contact point difference from among the plurality of potential contact point differences that has a smallest absolute value; and setting the first potential set of initial control values as the set of initial contact control values.

In an aspect of the first embodiment determining the set of initial contact control values may comprise using an initial contact point model for predicting a potential initial contact point based on the superset of calibration data.

In an aspect of the first embodiment the initial contact point model may be one of: a linear regression for predicting the potential initial contact point based on potential initial contact control values; a state-vector regression for predicting the potential initial contact point based on potential initial contact control values; and a neural network regression for predicting the potential initial contact point based on potential initial contact control values.

In an aspect of the first embodiment the partial field shape description may include an area of the partial field that is less than 30% of a full field area.

The first embodiment may also be a method of shaping a film on a substrate in a plurality of fields. A subset of fields among the plurality of fields that are categorized as the partial field are shaped using the method. The method may further comprise: adjusting, after the initial contact, the control conditions so that the template contacts all of the formable material in the particular field with the template; exposing the formable material under the template to actinic radiation after the template and the substrate are substantially parallel to each other; and separating the template from the formable material.

The first embodiment may also be a method of manufacturing an article from a substrate on which a film was shaped according to the method. The method may further comprise: processing the substrate; and forming the article from the processed substrate.

A second embodiment, may be a system comprising: one or more memory; and one or more processors. The one or more processors may be configured to determine a set of initial contact control values based on: a superset of calibration data; a desired initial contact point; and a partial field shape description. The one or more processors may also be configured to send instructions for a shaping system to contact the formable material in the partial field with the set of initial contact control values.

The second embodiment, may further comprise a template chuck configured to apply a pressure to a back surface of the template which bows out the template. The set of initial contact control values include the pressure.

The second embodiment, may further comprise a plurality of actuators configured to adjust a tilt of the template relative to the substrate. The set of initial contact control values include the tilt.

The second embodiment, may further comprise a substrate chuck configured to deform a shape of the substrate. The set of initial contact control values a set of control values supplied to the substrate chuck.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF THE FIGURES

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

FIG. 1 is an illustration of an exemplary nanoimprint lithography system having a template with a mesa spaced apart from a substrate as used in an embodiment.

FIGS. 2A-B are illustrations of exemplary templates that may be used in an embodiment.

Figure 3:
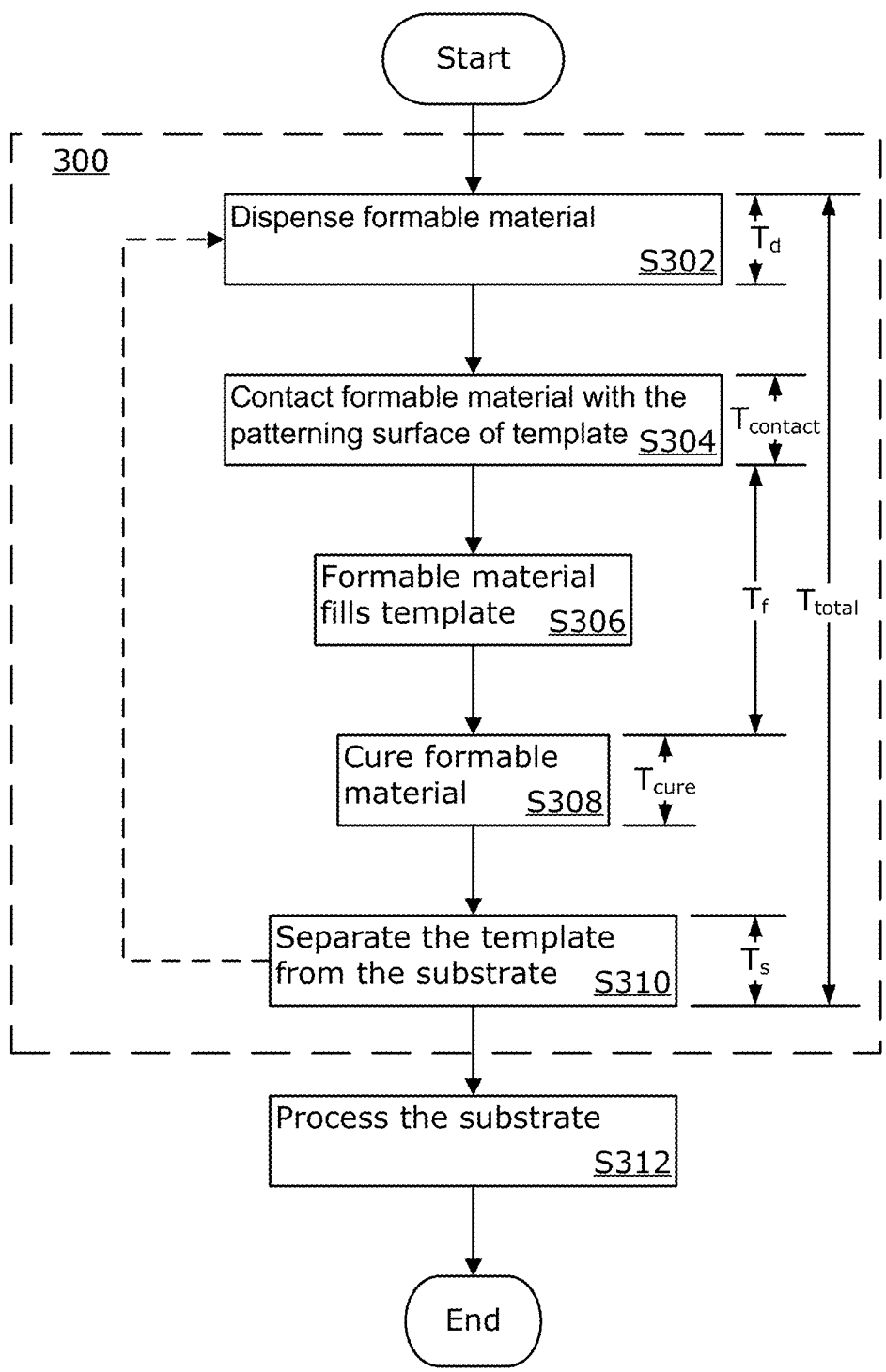
FIG. 3 is a flowchart illustrating an exemplary imprinting method as used in an embodiment.

Throughout the figures, the same reference numerals and characters, unless otherwise stated, are used to denote like features, elements, components, or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

The nanoimprint lithography technique can be used in a step and repeat manner to shape a film with a template in a plurality of fields across a substrate. The substrate and a patterning area (mesa) of a template may have different shapes and sizes. For example, the substrate may have a region to be patterned that is circular, elliptical, polygonal, or some other shape. While the mesa is typically smaller than the substrate and has a different shape than the substrate. The substrate is divided into a plurality of full fields and a plurality of partial fields. The full fields are the same size as the mesa. The partial fields are those fields on the edge of the substrate in which the edge of the region to be patterned on the substrate intersects with the patterning are of the mesa. These fields may be divided into multiple categories based on their shape and/or area relative to the full field.

The partial fields tend to have higher defectivity and/or higher processing time than full fields. In addition, small partial fields which have an area less than 30% of a full field are particularly challenging. What is needed is a way to lower defectivity and/or higher processing time for small partial fields. The applicant has found that the defectivity and/or higher processing time for small partial fields can be reduced if the initial contact point (ICP) is well chosen. One method of choosing the ICP was described in US Patent Publication No. 2023/0014261-A1.

Once the ICP is selected what is needed is a method of selecting control conditions which achieve the ICP this is typically done through modeling and extensive experimentation. Whenever the layout of imprint fields is changed for whatever reason these simulations and experiments need to be redone. What is needed a method of leveraging previous imprints from previous layouts to reduce the number of experiments that are needed to determine the control conditions to achieve a new ICP.

Shaping System

FIG. 1 is an illustration of a shaping system 100 (for example a nanoimprint lithography system or inkjet adaptive planarization system) in which an embodiment may be implemented. The shaping system 100 is used to produce an imprinted (shaped) film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the positional axes x, y, and z, and rotational axes θ, ψ, and φ. The substrate positioning stage 106, the substrate 102, and the substrate chuck 104 may also be positioned on a base (not shown). The substrate positioning stage may be a part of a positioning system. In an alternative embodiment, the substrate chuck 104 may be attached to the base.

Spaced-apart from the substrate 102 is a template 108 (also referred to as a superstrate). The template 108 may include a body having a mesa (also referred to as a mold) 110 extending towards the substrate 102 on a front side of the template 108. The mesa 110 may have a shaping surface 112 thereon also on the front side of the template 108. The shaping surface 112, also known as a patterning surface, is the surface of the template that shapes the formable material 124. In an embodiment, the shaping surface 112 is planar and is used to planarize the formable material. Alternatively, the template 108 may be formed without the mesa 110, in which case the surface of the template facing the substrate 102 is equivalent to the mesa 110 and the shaping surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The shaping surface 112 may have features defined by a plurality of spaced-apart template recesses 114 and/or template protrusions 116. The shaping surface 112 defines a pattern that forms the basis of a pattern to be formed on the substrate 102. In an alternative embodiment, the shaping surface 112 is featureless in which case a planar surface is formed on the substrate. In an alternative embodiment, the shaping surface 112 is featureless and the same size as the substrate and a planar surface is formed across the entire substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include a template magnification control system 121. The template magnification control system 121 may include piezoelectric actuators (or other actuators) which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to a shaping head 120 which is a part of the positioning system. The shaping head 120 may be moveably coupled to a bridge. The shaping head 120 may include one or more actuators such as voice coil motors, piezoelectric motors, linear motor, nut and screw motor, etc., which are configured to move the template chuck 118 relative to the substrate in at least the z-axis direction, and potentially other directions (e.g., positional axes x, and y, and rotational axes θ, ψ, and φ).

The shaping system 100 may further comprise a fluid dispenser 122. The fluid dispenser 122 may also be moveably coupled to the bridge. In an embodiment, the fluid dispenser 122 and the shaping head 120 share one or more or all of the positioning components. In an alternative embodiment, the fluid dispenser 122 and the shaping head 120 move independently from each other. The fluid dispenser 122 may be used to deposit liquid formable material 124 (e.g., polymerizable material) onto the substrate 102 in a drop pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the shaping surface 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The shaping system 100 may further comprise a curing system that induces a phase change in the liquid formable material into a solid material whose top surface is determined by the shape of the shaping surface 112. The curing system may include at least a radiation source 126 that directs actinic energy along an exposure path 128. The shaping head and the substrate positioning stage 106 may be configured to position the template 108 and the substrate 102 in superimposition with the exposure path 128. The radiation source 126 sends the actinic energy along the exposure path 128 after the template 108 has contacted the formable material 124. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124. In an embodiment, the actinic energy may be directed through both the template chuck 118 and the template 108 into the formable material 124 under the template 108. In an embodiment, the actinic energy produced by the radiation source 126 is UV light that induces polymerization of monomers in the formable material 124.

The shaping system 100 may further comprise a field camera 136 that is positioned to view the spread of formable material 124 after the template 108 has contacted the formable material 124. FIG. 1 illustrates an optical axis of the field camera's imaging field as a dashed line. As illustrated in FIG. 1 the shaping system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of: a CCD; a sensor array; a line camera; and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108; the separation of the template 108 from cured formable material; and can be used to keep track of the imprinting (shaping) process. The field camera 136 may also be configured to measure interference fringes, which change as the formable material spreads 124 between the gap between the shaping surface 112 and the substrate surface 130.

The shaping system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as lenses, mirrors, optical diaphragms, apertures, filters, prisms, polarizers, windows, adaptive optics, and/or light sources. The droplet inspection system 138 may be positioned to inspect droplets prior to the shaping surface 112 contacting the formable material 124 on the substrate 102. In an alternative embodiment, the field camera 136 may be configured as a droplet inspection system 138 and used prior to the shaping surface 112 contacting the formable material 124.

The shaping system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a SLM such as a digital micromirror device (DMD), Liquid Crystal on Silicon (LCoS), Liquid Crystal Device (LCD), etc., to modulate the spatio-temporal distribution of thermal radiation. The shaping system 100 may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has contacted the formable material 124. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and the visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, drop dispense, slot dispense, etc. In an embodiment, the substrate 102 may be a semiconductor wafer. In another embodiment, the substrate 102 may be a blank template (replica blank) that may be used to create a daughter template after being imprinted.

The shaping system 100 may include an imprint field atmosphere control system such as gas and/or vacuum system, an example of which is described in U.S. Patent Publication Nos. 2010/0096764 and 2019/0101823 which are hereby incorporated by reference. The gas and/or vacuum system may include one or more of pumps, valves, solenoids, gas sources, gas tubing, etc. which are configured to cause one or more different gases to flow at different times and different regions. The gas and/or vacuum system may be connected to a first gas transport system that transports gas to and from the edge of the substrate 102 and controls the imprint field atmosphere by controlling the flow of gas at the edge of the substrate 102. The gas and/or vacuum system may be connected to a second gas transport system that transports gas to and from the edge of the template 108 and controls the imprint field atmosphere by controlling the flow of gas at the edge of the template 108. The gas and/or vacuum system may be connected to a third gas transport system that transports gas to and from the top of the template 108 and controls the imprint field atmosphere by controlling the flow of gas through the template 108. One or more of the first, second, and third gas transport systems may be used in combination or separately to control the flow of gas in and around the imprint field.

The shaping system 100 may be regulated, controlled, and/or directed by one or more processors 140 (controller) in communication with one or more components and/or subsystems such as the substrate chuck 104, the substrate positioning stage 106, the template chuck 118, the shaping head 120, the fluid dispenser 122, the radiation source 126, the thermal radiation source 134, the field camera 136, imprint field atmosphere control system, and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. The controller 140 may include a plurality of processors that are both included in the shaping system 100a and in communication with the shaping system 100a. The processor 140 may be in communication with a networked computer 140a on which analysis is performed and control files such as a drop pattern are generated. In an embodiment, there are one or more graphical user interface (GUI) 141 on one or both of the networked computer 140a and a display in communication with the processor 140 which are presented to an operator and/or user.

Either the shaping head 120, the substrate positioning stage 106, or both varies a distance between the mold 110 and the substrate 102 to define a desired space (a bounded physical extent in three dimensions) that is filled with the formable material 124. For example, the shaping head 120 may apply a force to the template 108 such that mold 110 is in contact with the formable material 124. After the desired volume is filled with the formable material 124, the radiation source 126 produces actinic radiation (e.g., UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the shaping surface 112, defining a patterned layer on the substrate 102. The formable material 124 is cured while the template 108 is in contact with formable material 124, forming the patterned layer on the substrate 102. Thus, the shaping system 100 uses a shaping process to form the patterned layer which has recesses and protrusions which are an inverse of the pattern in the shaping surface 112. In an alternative embodiment, the shaping system 100 uses a shaping process to form a planar layer with a featureless shaping surface 112.

The shaping process may be done repeatedly in a plurality of imprint fields (also known as just fields or shots) that are spread across the substrate surface 130. Each of the imprint fields may be the same size as the mesa 110 or just the pattern area of the mesa 110. The pattern area of the mesa 110 is a region of the shaping surface 112 which is used to imprint patterns on a substrate 102 which are features of the device or are then used in subsequent processes to form features of the device. The pattern area of the mesa 110 may or may not include mass velocity variation features (fluid control features) which are used to prevent extrusions from forming on imprint field edges. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the shaping surface 112 in each imprint field. The patterned layer may also include one or more features such as protrusions which extend above the residual layer having a thickness. These protrusions match the recesses 114 in the mesa 110.

Template

FIG. 2A is an illustration of a template 108 (not to scale) that may be used in an embodiment. The shaping surface 112 may be on a mesa 110 (identified by the dashed box in FIG. 2A). The mesa 110 is surrounded by a recessed surface 244 on the front side of the template. The mesa 110 has a mesa height $h_T$. The mesa height $h_T$ may between 1-200 μm. Mesa sidewalls 246 connect the recessed surface 244 to shaping surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners. In an embodiment, the mesa sidewalls 246 may have one or more of a perpendicular profile; an angled profile; a curved profile; a staircase profile; a sigmoid profile; a convex profile; or a profile that is combination of those profiles. FIG. 2B is a perspective view of the template 108 (not to scale) showing the mesa edges 210e. FIG. 2B illustrate that the intersection of the mesa sidewalls 246 and the recessed surface 244 may have some curvature due to the process of etching away material form a template precursor to form the mesa 110 on the template 108. The template 108 may have a square planar shape with a template width $w_T$ as illustrated in FIGS. 2A-B. In an alternative embodiment, the template width $w_T$ is a characteristic width and a planar shape of the template 108 may be a rectangle, parallelogram, polygon, or circle, or some other shape. The template width $w_T$ may be between 10-450 mm.

Shaping Process

FIG. 3 is a flowchart of a method of manufacturing an article (device) that includes a shaping process 300 performed by the shaping system 100. The shaping process 300 can be used to form patterns in formable material 124 on one or more imprint fields (also referred to as: pattern areas or shot areas). The shaping process 300 may be performed repeatedly on a plurality of substrates 102 by the shaping system 100. The processor 140 may be used to control the shaping process 300.

In an alternative embodiment, the shaping process 300 is used to planarize the substrate 102. In which case, the shaping surface 112 is featureless and may also be the same size or larger than the substrate 102.

The beginning of the shaping process 300 may include a template mounting step causing a template conveyance mechanism to mount a template 108 onto the template chuck 118. The shaping process 300 may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the shaping system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprinting field i (index i may be initially set to 1) of the substrate 102 to a fluid dispense position below the fluid dispenser 122. The substrate 102, may be divided into N imprinting fields, wherein each imprinting field is identified by a shaping field index i. In which N is the number of shaping fields and is a real positive integer such as 1, 10, 62, 75, 84, 100, etc. $\{N \in \mathbb{Z}^+\}$. In a dispensing step S302, the processor 140 may cause the fluid dispenser 122 to dispense formable material based on a drop pattern onto an imprinting field. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field may be moved relative to the fluid dispenser 122 while the fluid dispenser is ejecting formable material 124. Thus, the time at which some of the droplets land on the substrate may vary across the imprint field i. The dispensing step S302 may be performed during a dispensing period $T_d$ for each imprint field i.

In an embodiment, during the dispensing step S302, the formable material 124 is dispensed onto the substrate 102 in accordance with a drop pattern. The drop pattern may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets.

After, the droplets are dispensed, then a contacting step S304 may be initiated, the processor 140 may cause one or both of the substrate positioning stage 106 and a template positioning stage to bring the shaping surface 112 of the template 108 into contact with the formable material 124 in a particular imprint field. The contacting step S304 may be performed during a contacting period $T_{contact}$ which starts after the dispensing period $T_d$ and begins with the initial contact of the shaping surface 112 with the formable material 124. In an embodiment, at the beginning of the contact period $T_{contact}$ the template chuck 118 is configured to bow out the template 108 so that only a portion of the shaping surface 112 is in contact with a portion of the formable material. In an embodiment, the contact period $T_{contact}$ ends when the template 108 is no longer bowed out by the template chuck 118. The degree to which the shaping surface 112 is bowed out relative to the substrate surface 130 may be estimated with the spread camera 136. The spread camera 136 may be configured to record interference fringes due to reflectance from at least the shaping surface 112 and the substrate surface 130. The greater the distance between neighboring interference fringes, the larger the degree to which the shaping surface 112 is bowed out.

During a filling step S306, the formable material 124 spreads out towards the edge of the imprint field and the mesa sidewalls 246. The edge of the imprint field may be defined by the mesa sidewalls 246. How the formable material 124 spreads and fills the mesa may be observed via the field camera 136 and may be used to track a progress of a fluid front of formable material. In an embodiment, the filling step S306 occurs during a filling period $T_f$. The filling period $T_f$ begins when the contacting step S304 ends. The filling period $T_f$ ends with the start of a curing period $T_c$. In an embodiment, during the filling period $T_f$ the back pressure and the force applied to the template are held substantially constant. Substantially constant in the present context means that the back pressure variation and the force variation is within the control tolerances of the shaping system 100 which may be less 0.1% of the set point values.

In a curing step S308, the processor 140 may send instructions to the radiation source 126 to send a curing illumination pattern of actinic radiation through the template 108, the mesa 110, and the shaping surface 112 during a curing period $T_c$. The curing illumination pattern provides enough energy to cure (polymerize) the formable material 124 under the shaping surface 112. The curing period $T_c$ is a period in which the formable material under the template receives actinic radiation with an intensity that is high enough to solidify (cure) the formable material. In an alternative embodiment, the formable material 124 is exposed to a gelling illumination pattern of actinic radiation before the curing period $T_c$ which does not cure the formable material but does increase the viscosity of the formable material.

In a separation step S310, the processor 140 uses one or more of: the substrate chuck 104; the substrate positioning stage 106, template chuck 118, and the shaping head 120 to separate the shaping surface 112 of the template 108 from the cured formable material on the substrate 102 during a separation period $T_s$. If there are additional imprint fields to be imprinted, then the process moves back to step S302. In an alternative embodiment, during step S302 two or more imprint fields receive formable material 124 and the process moves back to steps S302 or S304.

In an embodiment, after the shaping process 300 is finished additional semiconductor manufacturing processing is performed on the substrate 102 in a processing step S312 so as to create an article of manufacture (e.g., semiconductor device). In an embodiment, each imprint field includes a plurality of devices.

The further semiconductor manufacturing processing in processing step S312 may include etching processes to transfer a relief image into the substrate that corresponds to the pattern in the patterned layer or an inverse of that pattern. The further processing in processing step S312 may also include known steps and processes for article fabrication, including, for example, inspection, curing, oxidation, layer formation, deposition, doping, planarization, etching, formable material removal, dicing, bonding, packaging, mounting, circuit board assembly, and the like. The substrate 102 may be processed to produce a plurality of articles (devices).

Layout of Fields on Substrate

Figure 4A:
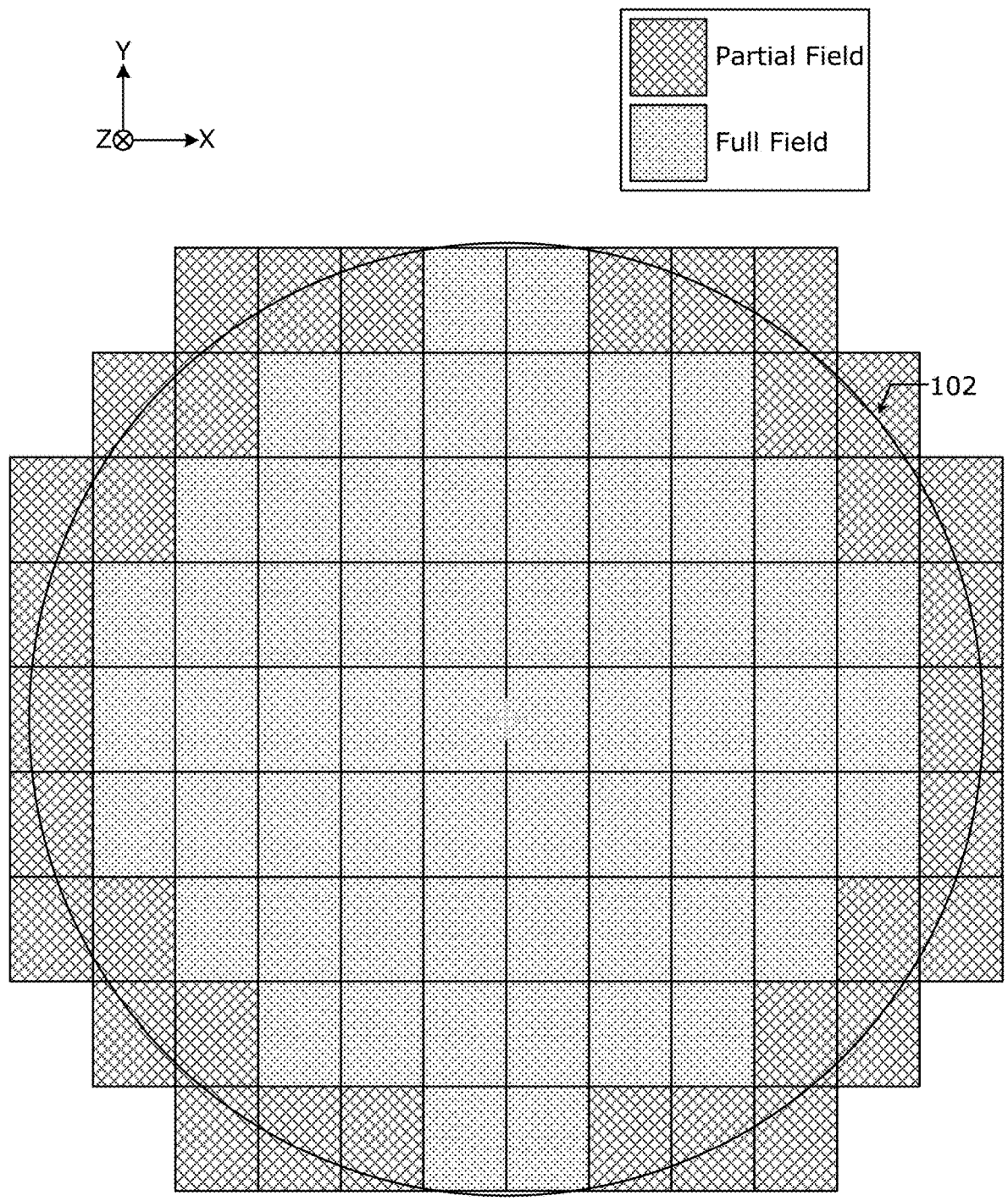
FIGS. 4A-B are illustrations of layouts of fields on substrates as used in an embodiment.
Figure 4B:
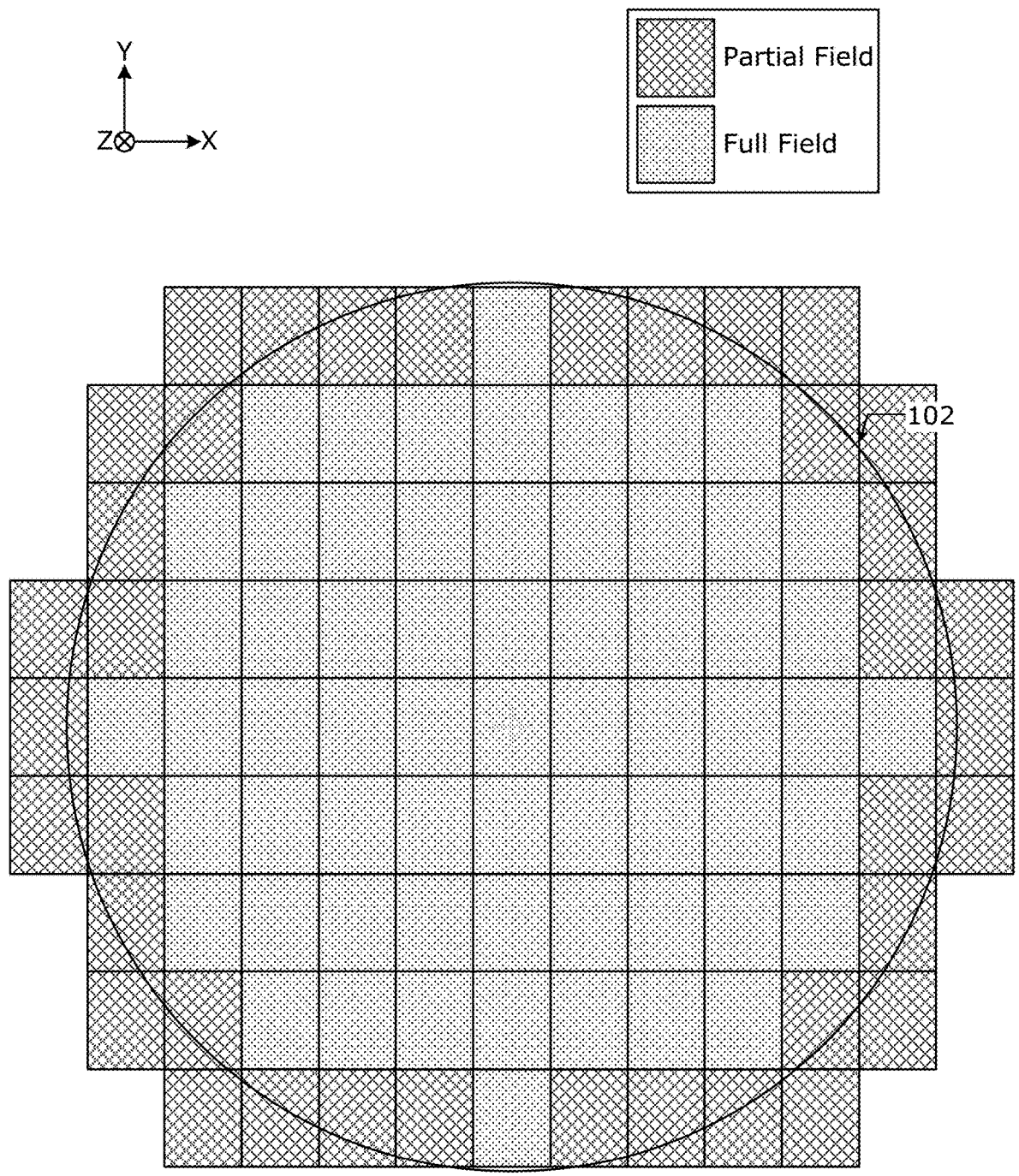

The shaping process 300 can be used in a step and repeat manner to shape a film with a template 108 in a plurality of fields across the substrate 102. The substrate 102 and a patterning area (mesa 110) of a template 108 may have different shapes and sizes. For example, the substrate 102 may have a region to be patterned that is circular, elliptical, polygonal, or some other shape. While the mesa 110 is typically smaller than the substrate 102 and has a different shape then the substrate 102. The substrate 102 is divided into a plurality of full fields and a plurality of partial fields as illustrated in FIGS. 4A-B. The full fields are the same size as the mesa 110. The partial fields are those fields on the edge of the substrate in which the edge of the region to be patterned on the substrate intersects with the patterning area of the mesa. These fields may be divided into multiple categories based on their shape and/or area relative to the full field. A subset of those partial fields maybe categorized as small partial fields.

Small Partial Fields

Figure 4C:
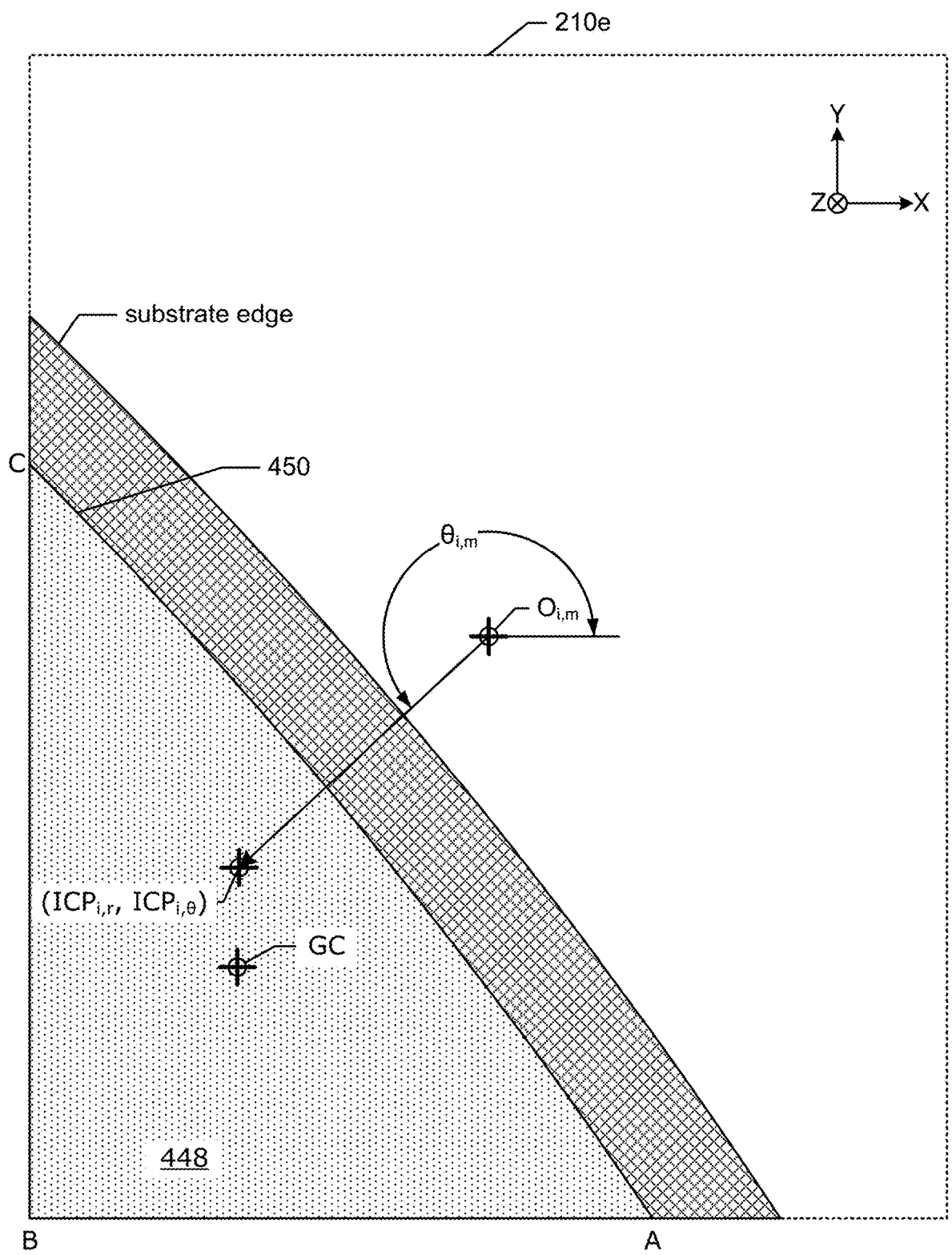
FIGS. 4C-D are illustrations of a small partial field on substrate as used in an embodiment.

FIG. 4C is an illustration of a particular small partial field 448 on a substrate 102 in the coordinate system of the mesa 110. In FIG. 4C the mesa edges 210e are illustrated as dotted lines. FIG. 4C also shows the mesa origin $O_{i,m}$ of the coordinate system of the mesa which is at the center of the mesa 110. A patternable area edge 450 is shown inset from the substrate edge. In an embodiment, the patternable area edge 450 may be inset from the substrate edge by between 0 to 3 mm. The non-patterned area is illustrated with a diamond gird pattern in FIG. 4C. The width of the non-patterned area may be determined by an edge treatment of the substrate 102 which may have been treated to have rounded, beveled, or chamfered edges. The substrate 102 may also have undergone numerous previous processes which cause the edge to have a random unpredictable pattern. The substrate 102 may also have an orientation feature such as a notch or flat edge.

As illustrated in FIG. 4C the extent of the particular small partial field 448 is defined on two sides by the mesa edge 210e which intersect at a vertex B. The extent of the small partial field 448 is also defined by the arc of the patternable area edge 450. The arc of the patternable area edge 450 may be defined as a portion of a circle, an ellipse, a spline, a polygon, or other geometric quantity that can be used to define a shape of the patternable area edge 450. The arc of the patternable area edge 450 intersects the mesa edges 210e at vertices A and C. This is an exemplary small partial field. The small partial field may have other shapes, which have at least on curved edge and 1 or more straight edges.

Initial Contact Point

The shaping process 300 is controlled using numerous parameters. In an embodiment, one of the process parameters used during the contacting step S302 is the initial contact point (ICP) for each field i ($ICP_i=\{ICP_{i,\theta}, ICP_{i,r}\}$i). In an embodiment, polar coordinates relative to the substrate center ($O_s$) may be used to describe ICP. The location of the $ICP_i$ may also be described as angle $\theta_{i,m}$ relative to center of the mesa $O_{i,m}$. In an alternative embodiment, another coordinate system may be used. The ICP is the point in the field in which the template 108 is brought into initial contact with formable material 124 on the substrate 102. The template 108 is bowed out by the template chuck 118 so that only a small portion of the template 108 is brought into contact with the formable material 124 at the ICP. The bowing of the template is reduced as the template is brought closer to the substrate, until the template is flat, this is done to allow gas to escape during the contacting step S304 and to ensure that the formable material spreads in a controlled manner.

For full fields, the ICP is at the center of the full field the mesa $O_{i,m}$. While the ICP is a single point, the actual initial contact area is a larger area which may have an area of for example of 1 to 20 mm² which can be determined by when interference fringes first start to show up in images obtained by the field camera 136. For partial fields, determining the ICP is more complicated which depends on the shape and area of the partial field and the location of the partial field relative to the center of the substrate ($O_s$). For large partial fields (90% to 99% of the full field) the ICP may be at the same point as the full field or somewhere within the initial contact area. For medium size partial fields, the initial contact point may be determined by calculating a geometric center (GC) or a centroid of the partial field. There are several methods that may be used for determining the GC. One method of estimating the GC is to use a method of intersecting meridians. Another method is to approximate the edge of the partial field using a function. The function may be defined in a piecewise manner and be continuous over the partial field. Integration may then be used to estimate a geometric center of the partial field. A third method of identifying the GC is to minimize distances from the GC to the farthest corners of the partial field.

The applicant has found that the GC works well for large and medium size fields; but it does not work as well for small partial fields. One method of determining a desired ICP for small partial fields is described in US Patent Publication No. 2023-0014261 which is hereby incorporated by reference. In an embodiment a partial field may be categorized as a small partial field 448 if it has an area that is less than a fractional area threshold for example 35% of a full field. An alternative embodiment, the fractional area threshold may have a different value for example one of: 1%; 5%; 10%; 15%; 20%; 25%; 30%; 45%; etc. What is needed is a better method of determining control values for achieving the ICP for these small partial fields 448. In an embodiment, the ICP is not the GC for small partial fields and the ICP is coincident with the center of the mesa or could alternatively be the GC for partial fields that are not categorized as small partial fields.

Figure 4D:
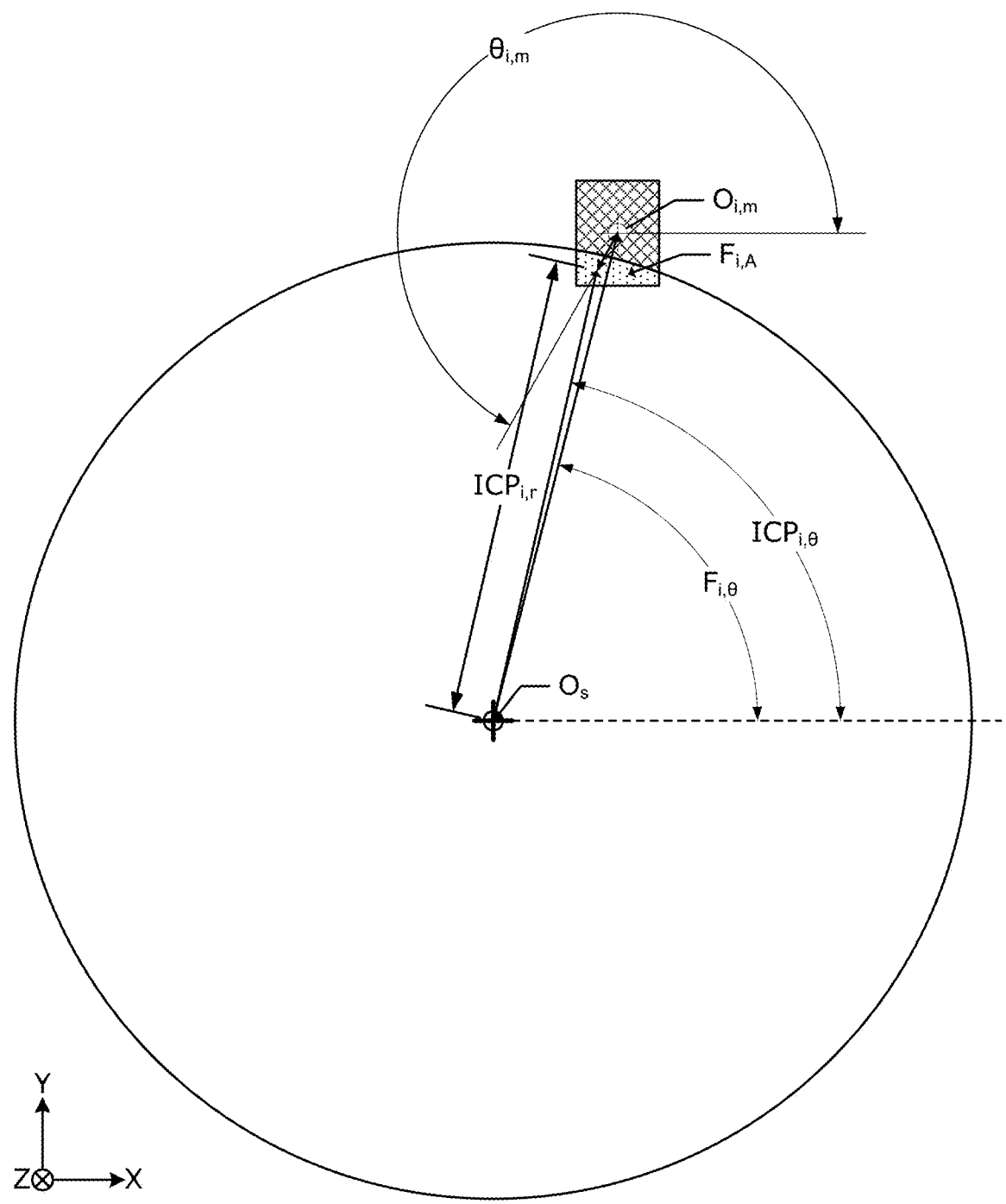

As illustrated in FIGS. 4A-B different layouts of imprint fields results in different sizes and shapes of partial fields. The partial fields can have complex shapes with 1 to 4 four straight edges and 1 curved edge that meet at 2-5 vertexes for the example where the mesa is a quadrangle, and the substrate is a circle. When determining ICP control values for a partial field it is necessary to know the shape of the partial field. The traditional method of describing the shape of a partial field is to identify positions of all of the vertexes of the shape and the shape of lines connecting all these vertexes. Another method of describing a partial field is as the intersection of two shapes in which the size, shape, and relative positions of these shapes are listed. The applicant has found while this would provide a complete description of the partial field it is not necessary for purposes of determining ICP control values. The applicant has found that a partial field shape description $F_i$ for a partial field i can be simplified to just two or three values. For example, a partial field shape description set $F_i$ may include: the area of the partial field shape relative to the area of a full field ($F_{i,A}$); and an azimuthal angle that represents the angle in the plane of the substrate of a center of the mesa relative to the middle of the substrate ($F_{i,\theta}$) ($F_i=\{F_{i,A}, F_{i,\theta}\}$) as illustrated in FIG. 4D. Also illustrated in FIG. 4D in the desired ICP for the imprint field i ($ICP_i=\{ICP_{i,r}, ICP_{i,\theta}\}$). As illustrated in FIG. 4D the azimuthal coordinate of the imprint field i ($ICP_{i,\theta}$) is different than the azimuthal coordinate of the partial field shape description ($F_{i,\theta}$) although in some circumstances they may be the same.

Method of Determining ICP Control Values

The shaping process 300 includes a contacting step S304. The contacting step S304 includes receiving a set of contact control values $V_i$ for a partial field i from a processor 140. The set of contact control values $V_i$ may include: a template cavity pressure $P_T$ applied to a portion of a template during initial contact of the template 108 with formable material 124 on a substrate 102 which causes the template 108 to be curved with radius of curvature of the template $R_T$; a set of substrate pressures ($P_{Sa}$, $P_{Sb}$, and $P_{Sc}$) applied to a portion of the substrate during initial contact of the template with formable material on the substrate which causes the substrate 102 in the partial field to be curved with a radius of curvature $R_S$; and a tilt ($\theta_T$) of the template relative to the substrate during initial contact of the template with formable material on the substrate. In an embodiment, the template tilt may be characterized by two values or one value and a formula describing a relationship between a first value and a second value. The illustrative set of substrate pressures shown here has three elements, but it may be between 1-10 elements in the set of substrate pressures.

Figure 5A:
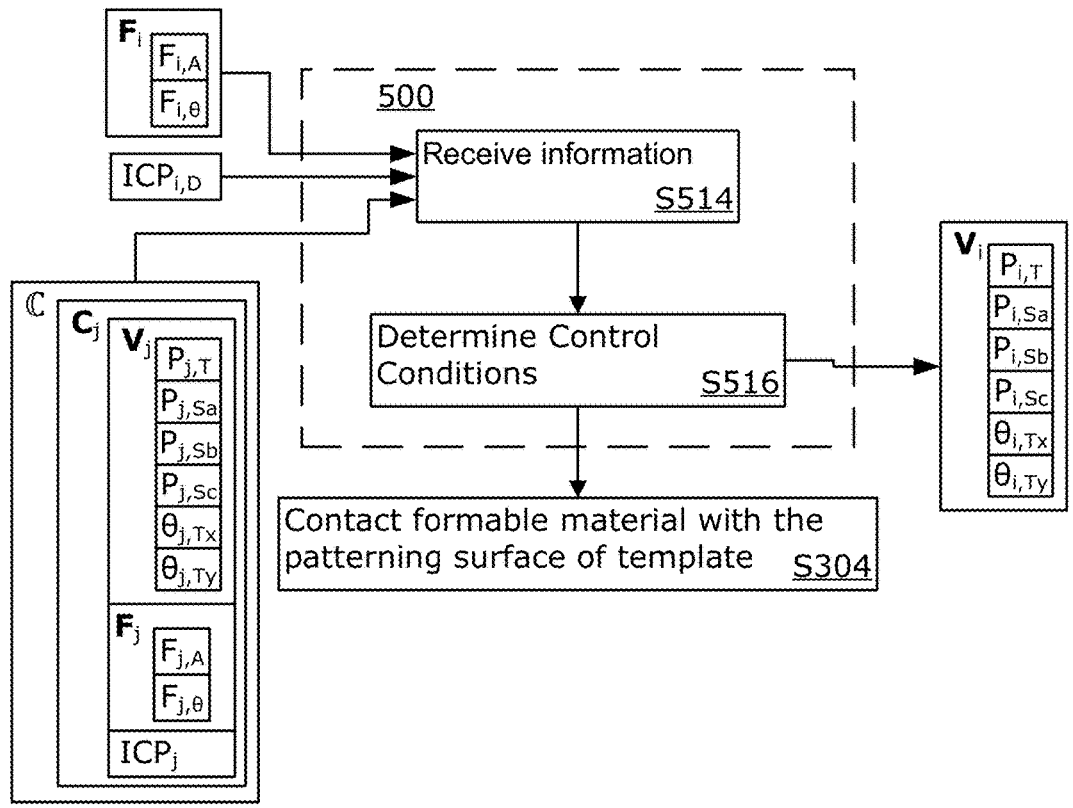
FIGS. 5A-B are flowcharts illustrating a method of determining ICP for small partial fields as used in an embodiment.

FIG. 5A is flowchart of an ICP control value determination process 500 for small partial fields 448. The process 500 may include a receiving step S514 in which a processor 140 receives: a partial field description $F_i$ about a partial field i; a desired initial contact point $ICP_{i,D}$ for a partial field i; and a superset of calibration data $\mathbb{C}$. The desired initial contact point $ICP_{i,D}$ for a partial field i may be specified by the customer, may be determined via experimentation, or may be determined using known methods, for example those described in US Patent Publication No. 2023-0014261-A1. The superset of calibration data $\mathbb{C}$ is a superset. An individual element j of the superset is a set of calibration Data $C_j$. Each individual element j represents the results of a successful imprinting process j on a partial field. The set of calibration data $C_j$ may include: a set of control conditions; a partial field description; and the initial contact point. For example the set of calibration data $C_j$ associated with a specific imprint process j may include: the tilt of the template tilt ($\theta_{j,T}$); one or more substrate pressure control values ($P_{j,Sa}$, $P_{j,Sb}$, and $P_{j,Sc}$); Template Cavity Pressure ($P_{j,T}$); Area of the Partial field ($F_{j,A}$); and azimuthal angle of the partial field ($F_{j,\theta}$). The superset of calibration data $\mathbb{C}$ may include 10 s; 100 s or 1000 s of sets of calibration Data $C_j$.

The ICP control value determination process 500 may include a control condition determination step S516 in which the set of contact control values $V_i$ which allow the template 108 to initially contact the formable material 124 at the $ICP_{i,D}$ are determined based on the partial field description $F_i$, and the superset of calibration data $\mathbb{C}$. The control condition determination step S516 may output a set of contact control values $V_i$ which may then be used in a step S304 to imprint partial field i. The set of contact control values $V_i$ may include: a template cavity pressure $P_{i,T}$; a set of substrate pressures ($P_{i,Sa}$, $P_{i,Sb}$, and $P_{i,Sc}$); and a template tilt ($\theta_{i,T}$).

Figure 5B:
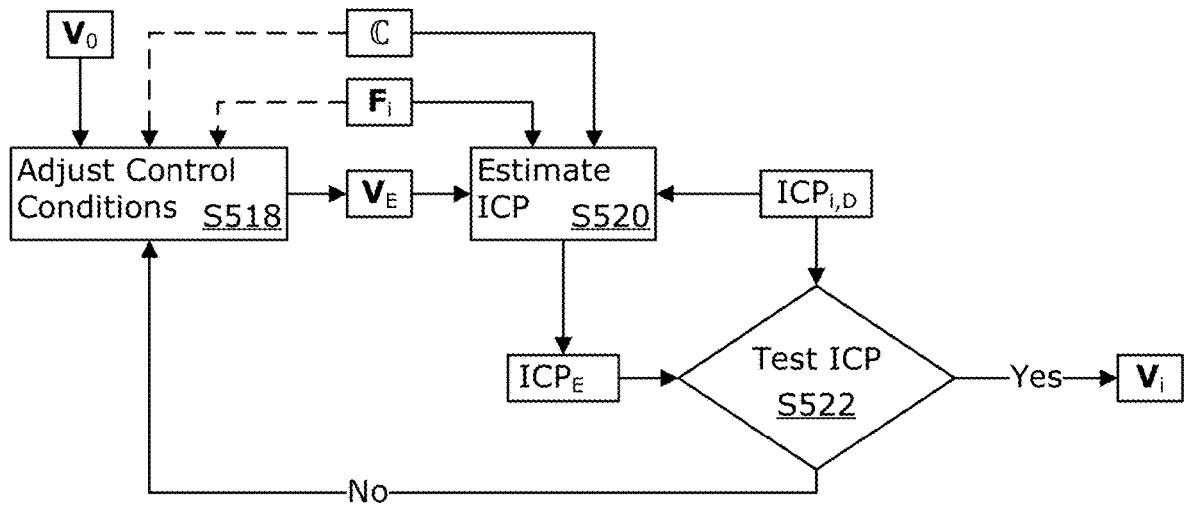

The control condition determination step S516 may use a recursive method that makes use of a model for estimating the ICP based on an estimate of the control conditions as illustrated in FIG. 5B. For example, the control condition determination step S516 may include an adjusting control conditions step S518. The adjusting control conditions step S518 may receive: an initial guess of the set of contact control values $V_0$; partial field description $F_j$; and a superset of calibration data $\mathbb{C}$. The adjusting control conditions step S518 generates an estimated set of contact control values $V_E$ based on the information received.

The control condition determination step S516 may include an ICP estimating step S520 that generates an estimated ICP ($ICP_E$) based on: an ICP model; the estimated set of contact control values $V_E$; the partial field description $F_i$; a desired initial contact point $ICP_D$; and the superset of calibration data $\mathbb{C}$.

The control condition determination step S516 may include an ICP testing step S522. The ICP testing step S522 may include comparing the estimated $ICP_E$ to see if it is within an ICP threshold of the desired initial contact point $ICP_D$. If the answer is yes, that $ICP_E$ is within an ICP threshold of the desired initial contact point, then the set of contact control values $V_i$ for imprint field i is set to the estimated set of contact control values $V_E$. If the answer is no, that $ICP_E$ is not within an ICP threshold of the desired initial contact point, then the adjusting control conditions step S518 is repeated. The repetition of the adjusting control conditions step S518 is different from the previous iteration of the adjusting control conditions step S518.

Initial Contact Control Values

Figure 6A:
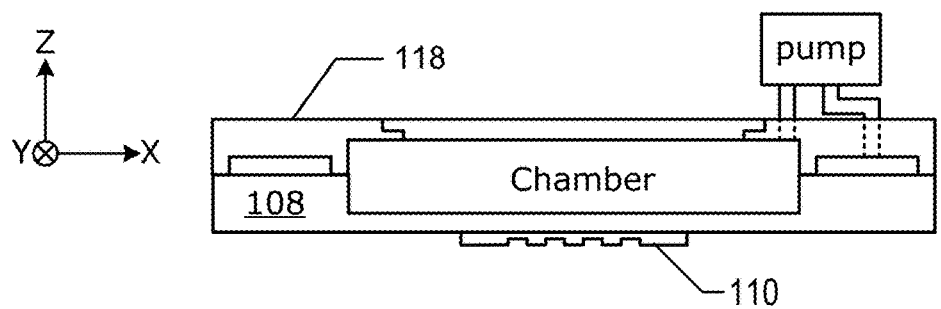
FIGS. 6A-F are illustrations of a small partial field on substrate and template as used in an embodiment.
Figure 6B:
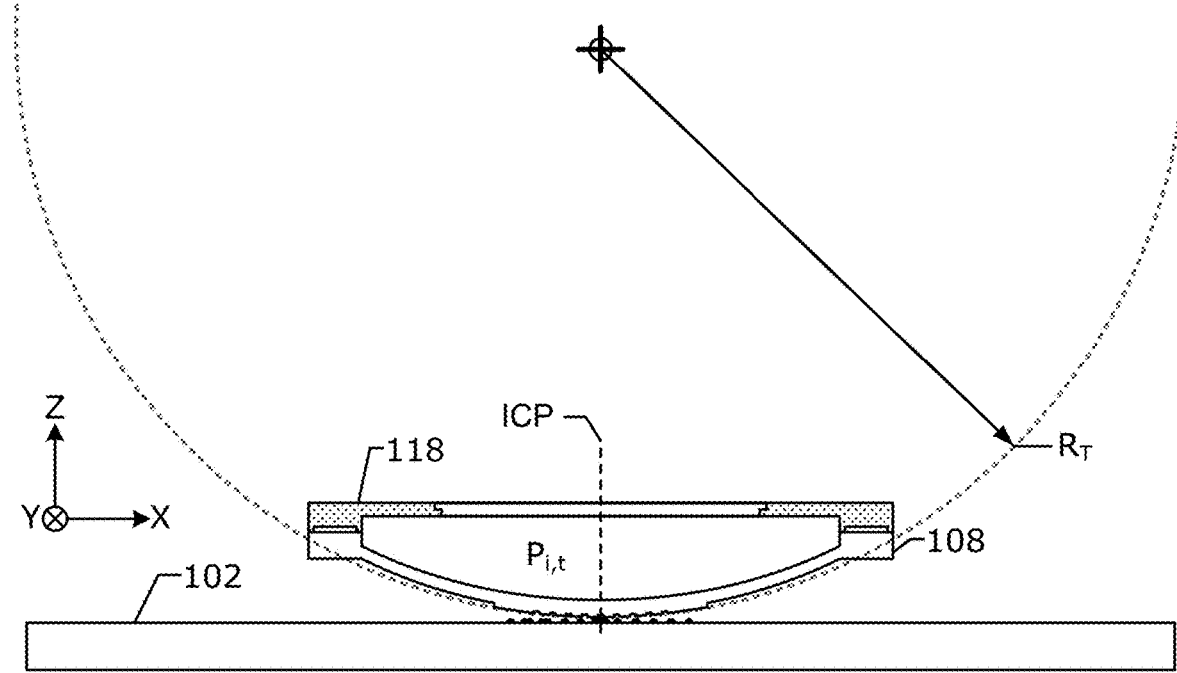

The set of contact control values $V_i$ for an imprint field i may include a template back pressure ($P_{i,T}$) that is applied by the template chuck 118 to a back surface of the template which bows out the template 108 when imprinting partial field i. FIG. 6A is an illustration of a pump connected to an exemplary template chuck 108 for holding a template 108 details of which are described in US Patent Publication No. 2017/0165898-A1 which is hereby incorporated by reference in its entirety. The template chuck 118 may include one or more vacuum portions which hold the template 108 and a chamber portion which can be used to bow out template 108 as illustrated in FIG. 6B when it is contacting a full field i. By increasing the pressure in the chamber above the ambient pressure of the shaping surface 112, the template 108 is bowed out causing the shaping surface 112 to have a curvature that may be approximated by a radius of curvature of the template ($R_T$) at the ICP. The radius of curvature of the template $R_T$ is an approximate representative of a shape of the shaping surface 112 at the ICP. A polynomial (for example a fourth order polynomial) may also be used to approximate the shape of the shaping surface 112 in the region of the ICP at the time of initial contact. A finite element model or other simulation model may be used to determine a shape of the shaping surface under different control conditions.

Figure 6C:
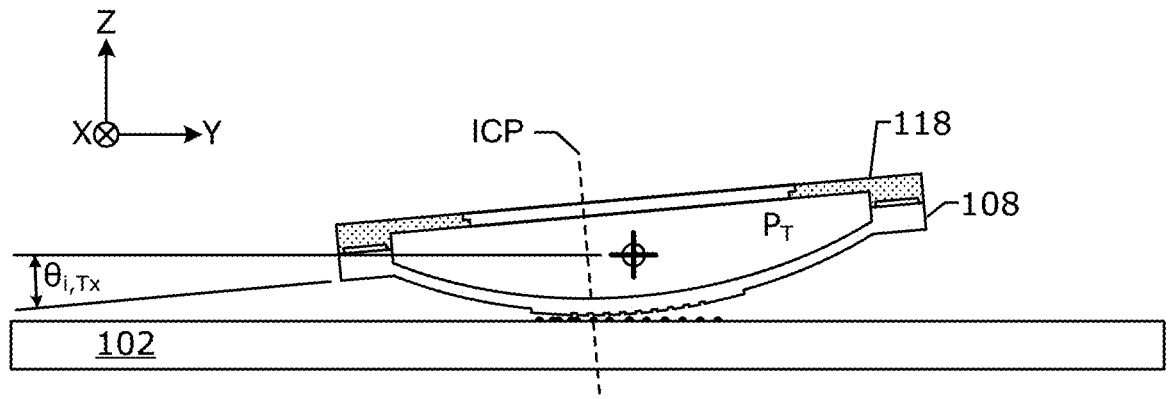

The control conditions may include a tipping angle of the template ($\theta_{Tx}$ rotation of the template about the x-axis) and a tilting angle of the template ($\theta_{Ty}$ rotation of the template about the y-axis), which together are the template control angles ($\theta_{i,T}=\{\theta_{i,Tx}, \theta_{i,Ty}\}$) relative to the substrate as illustrated in FIG. 6C when imprinting a full field i. In an embodiment, $\theta_{Tx}$ may be a function G of $\theta_{Ty}$ and one or both components of the partial field description F of the imprint field i ($\theta_{i,Tx}=G(\theta_{i,Ty},F_i)$). In which case only one component of the template control angles needs to be known. The function G may be determined experimentally or through simulation such that certain conditions are maintained. The imprint head 120 may include a plurality of actuators that are used to position the template 108 relative to the substrate 102 these plurality of actuators can also be used to tilt the shaping surface 112 relative to the substrate 102. FIG. 6C shows the tilt of a reference surface (front surface of the template chuck) relative to the substrate 102 which is at the same angle as shaping surface 112 when it is not bowed out.

Figure 6D:
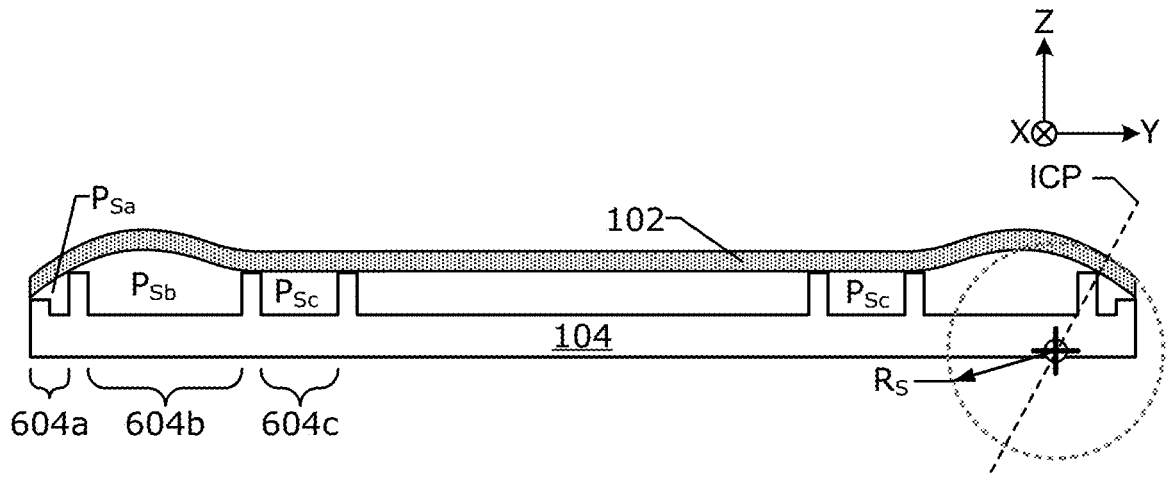

The control conditions may include a set of substrate chuck control values supplied to the substrate chuck 104. The substrate chuck 104 may deform a shape of the substrate 102. As illustrated in FIG. 6D, the substrate chuck 104 may be a zone chuck in which different zones (for example outer zone 604a, first inner zone 604b, second inner zone 604c, etc.) may be supplied with different amounts of positive or negative pressure which causes the substrate to be deformed by between 1-10 μm. The substrate chuck 104 has at least 2 zones but may have 3, 4, 5, 6, 7, 8, 9, 10, or more zones. For example, positive pressure may be supplied to the first inner zone 604b while negative pressures are supplied to the outer zone 604a and the second inner zone 604c. As with the template the shape of the substrate surface 130 may be approximately represented by a radius of curvature of the substrate ($R_S$) at the ICP. A polynomial (for example a fourth order polynomial) may also be used to approximate the shape of the shaping surface 112 in the region of the ICP at the time of initial contact. A finite element model or other simulation model may be used to determine a shape of the shaping surface under different control conditions.

Figure 6E:
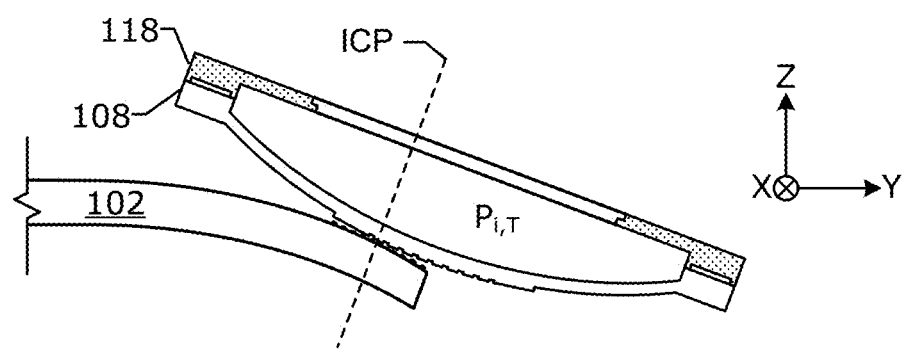

The control conditions (a template cavity pressure $P_T$ for controlling the radius of curvature of the template $R_T$; substrate pressures $P_{Sa}$, $P_{Sb}$, and $P_{Sc}$ for controlling the radius of curvature of the substrate $R_S$; template tilts $\theta_{Tx}$ and $\theta_{Ty}$; etc.) may be adjusted in combination or independently to control where the ICP is on the small partial field 448 as illustrated in FIG. 6E. The control conditions may include additional parameters which describe the shapes and orientations of the shaping surface 112 at ICP and the substrate surface 130 at ICP. The control parameters may include a plurality of control values and/or trajectories (pressures, currents, voltages, binary control signals, etc.) which are used to determine the shapes and orientations of the shaping surface 112 at ICP and the substrate surface 130 at ICP. The applicant has found that there are typically multiple different solutions to the selection of control conditions to achieve a specific ICP. The selection of which of these solutions is appropriate may depend upon the small partial field size, overlay constraints, alignment constraints, defectivity, process time, etc. This will also have an impact on which control conditions are adjusted in step S518. In an embodiment, the adjusting control conditions step S518 is performed by adjusting template cavity pressure $P_T$ while keeping the other control conditions at default setting(s) depending on the partial field area $F_{i,A}$ and/or the azimuthal angle of the partial field ($F_{i,\theta}$).

The amount of pressure that is supplied to the chamber depends on the desired radius of curvatures ($R_T$, $R_S$) at ICP and during the filling step S306 which may be determined based on reducing non-fill defects caused by gas not escaping during the filling step S306 for a given fill time. There are control limitations on the control parameters based on the mechanical characteristics of the template 108, the substrate 102, and the shaping system 100. These limitations prevent: the recessed surface 244 of the template from contacting the substrate surface 130 or an applique surrounding the substrate; and/or the shaping surface 112 from contacting the applique surrounding the substrate. In an alternative embodiment, the ICP is chosen within the ICP range based on limitations on the control parameters. These limitations may be determined experimentally, and/or using a finite element model or other simulation methods. For example, when both the template and substrate are flat the template angle can be calculated using trigonometry as described in equation (1) below. Once the shape of a bowed out shaping surface 112 and/or shape of bowed out substrate surface 130 are determined coordinate transformations may be used to determine the limitations. The relationship between $\theta_{i,Tx}$ and $\theta_{i,Ty}$ is also described in equation (1) below for an ideal value for $\theta_{i,Tx}$ and $\theta_{i,Ty}$. The applicant has found that an ideal solution is not always effective and other values for $\theta_{i,Tx}$ and $\theta_{i,Ty}$ must be determined through simulation and experimentation.

$$\theta_{max} = \tan^{-1}\left(2\frac{h_T}{w_T}\right) \quad (1)$$

-continued $$\theta_{i,Tx} = \begin{cases} \theta_{max} sig(\cos(\theta_{i,m})), & \cos(\theta_{i,m}) > \sin(\theta_{i,m}) \\ \dfrac{\theta_{i,Ty}}{\tan(\theta_{i,m}) \, sig(\sin(\theta_{i,m}))}, & \cos(\theta_{i,m}) \leq \sin(\theta_{i,m}) \end{cases}$$

$$\theta_{i,Ty} = \begin{cases} \theta_{i,Tx} \tan(\theta_{i,m}) \, sig(\sin(\theta_{i,m})), & \cos(\theta_{i,m}) > \sin(\theta_{i,m}) \\ \theta_{max} sig(\sin(\theta_{i,m})), & \cos(\theta_{i,m}) \leq \sin(\theta_{i,m}) \end{cases}$$

Generating the Superset of Calibration Data ℂ

Figure 6F:
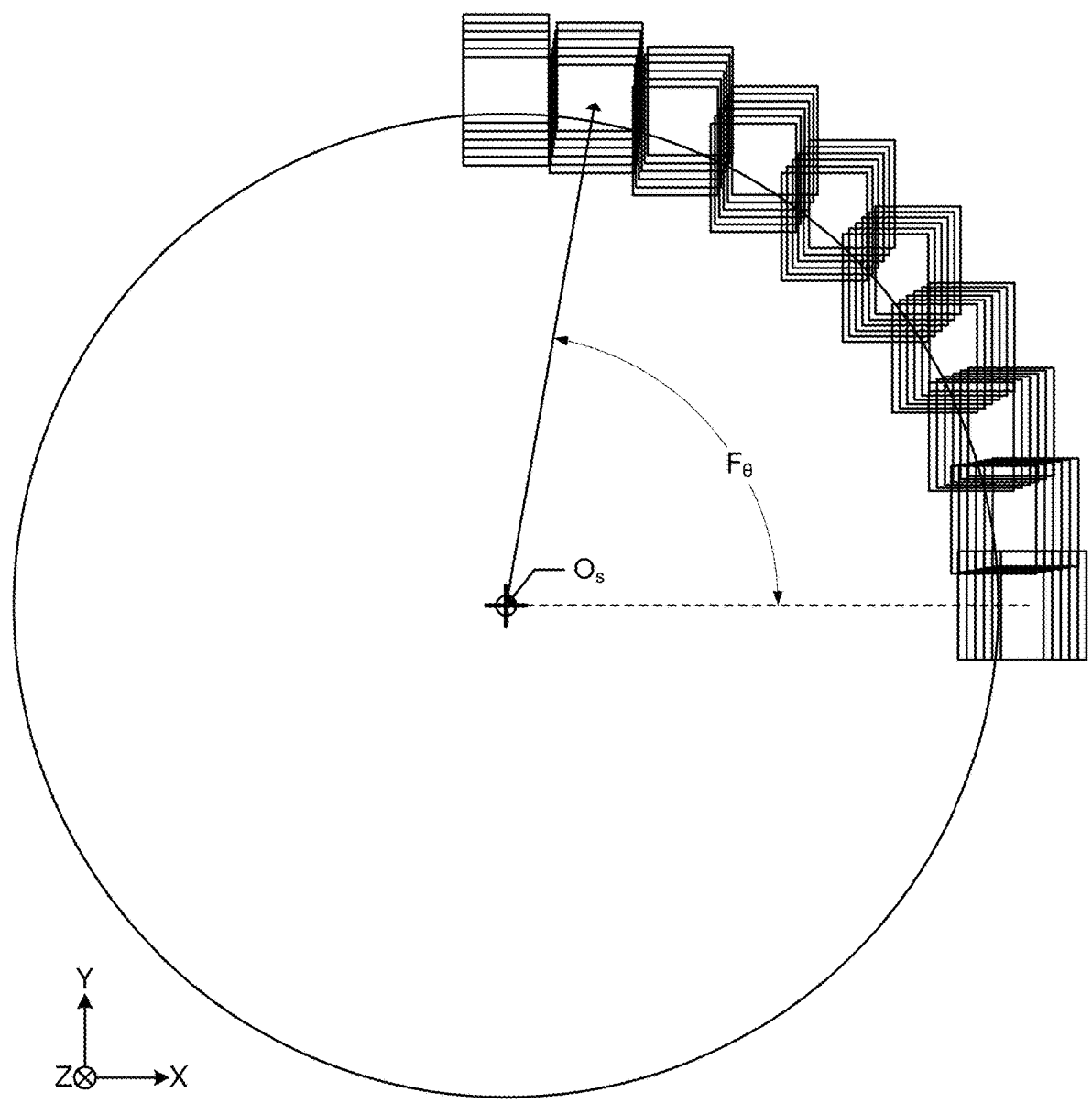
Figure 7A:
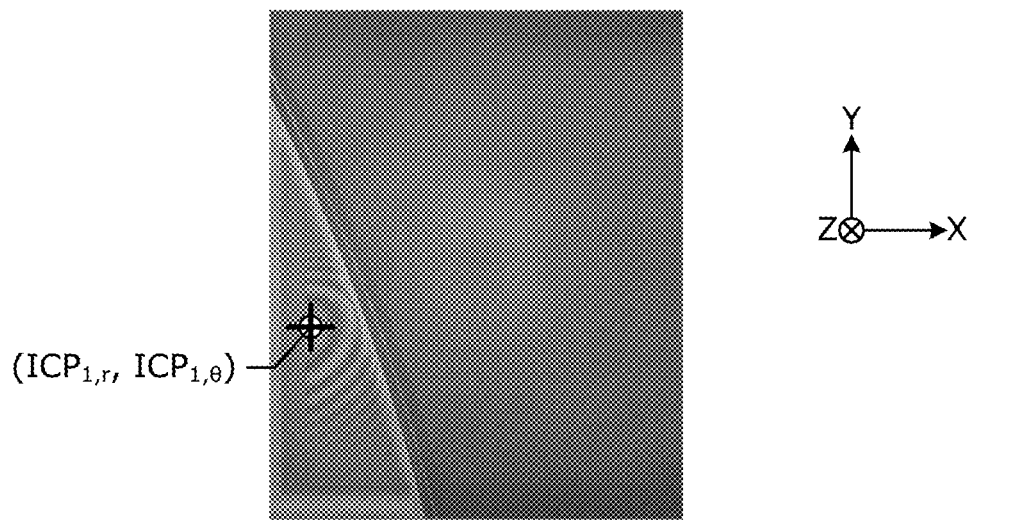
FIGS. 7A-C are field camera images showing the initial contact of a template on a partial field of a substrate.
Figure 7B:
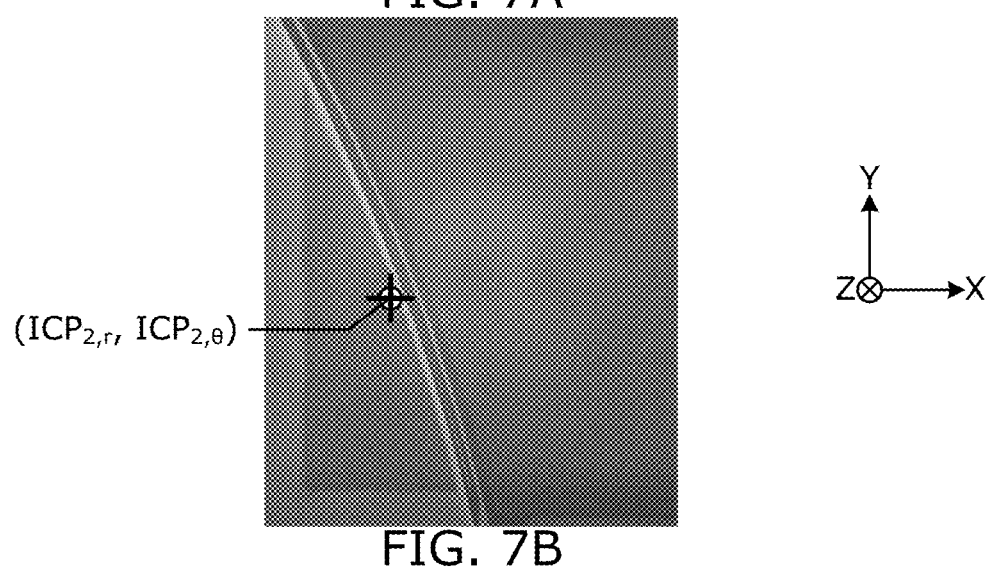
Figure 7C:
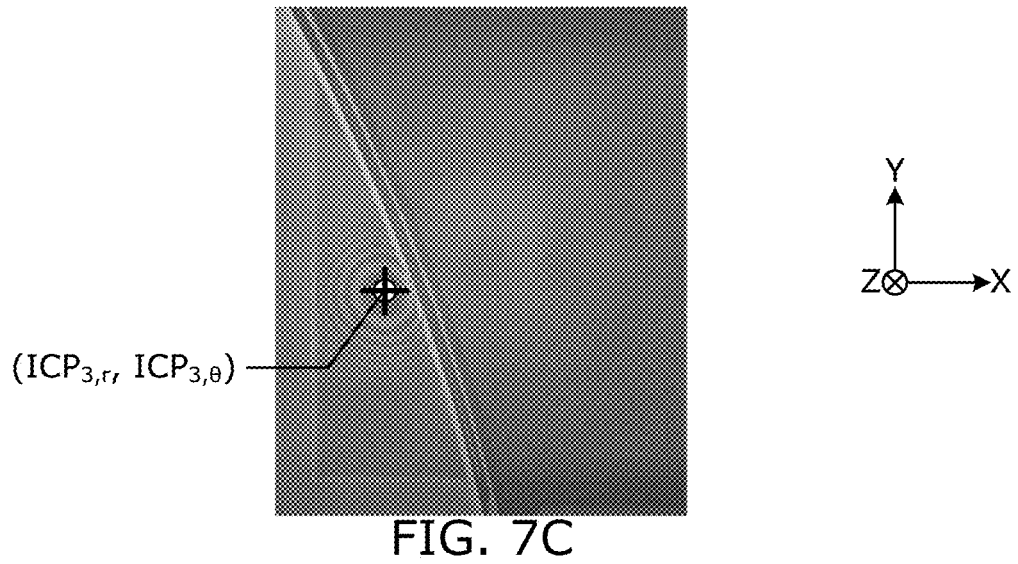

The applicant has found that each individual element of the superset of calibration data $C_j$ should include: control values $V_j$; a partial field description $F_j$; and the initial contact point $ICP_j$. Each set of calibration data $C_j$ may be determined via experimentation. In which a series of experiments are performed at a series of different partial fields as illustrated in FIG. 6F. For each partial field j with a specific partial field description ($F_j$) multiple experiments are performed with different sets of control values $V_j$ that each produce a different $ICP_j$. For example, FIGS. 7A-C show three such experiments which were performed at the same partial field location with an identical partial field description ($F_1=F_2=F_3$) on the substrate but have has different control values ($V_1 \neq V_2 \neq V_3$).

During the imprinting process the field camera 136 obtains images which show interference fringes due to reflections from the shaping surface 112 and the substrate surface 130 which occur during the initial contact of the contacting step S304. The processor 140 may be used to calculate a center point (or centroid) of these interference fringes. This may be done by fitting circles or ellipses to one or more of the interference fringes and the estimating a center (or centroid) of these circles or ellipses. The ICP may then be calculated as this center for example in polar coordinates. In an alternative embodiment, The ICP is calculated as a geometric center (or centroid) of a wetted area at initial contact. The wetted area is estimated as an area surrounded by an innermost interference fringe. In an embodiment, the azimuthal coordinate ($ICP_{E,\theta}$) of the ICP is not calculated and only radial coordinate ($ICP_{E,r}$) of the ICP is used. The applicant has found that the azimuthal coordinate $ICP_{E,\theta}$) does not need to be as tightly controlled as the radial coordinate of the $ICP_{E,r}$. In an embodiment, the radial coordinate that is reported and/or used is offset relative to substrate edge. For example, for a substrate that has a 150 mm radius, and has an $ICP_{E,r}$ radial distance of 148 mm, but that value for $ICP_{E,r}$ that is reported and/or used in the method is 2 mm. In an embodiment, each polar coordinate of the ICP has a different threshold in which the azimuthal coordinate ($ICP_{E,\theta}$) is targeted with a wider threshold while the radial coordinate ($ICP_{E,r}$) of the ICP is controlled within a narrow range. In an embodiment, the thresholds vary with the partial field description F. For example, in an embodiment, the threshold for testing the radial component of the $ICP_{E,r}$ may be a function of the partial field area $F_{i,A}$, while the threshold for testing the azimuthal coordinate of the $ICP_{E,\theta}$, may be a function of one or both of the partial field area $F_{i,A}$ and the azimuthal angle of the partial field $F_{i,\theta}$. FIG. 7A illustrates an experiment which resulted in an $ICP_{1,r}$ that was too small, such that the ICP was too far from the patternable area edge 450. FIG. 7B illustrates an experiment which resulted in an $ICP_{2,r}$ that was too large, the ICP was too close to the patternable area edge 450. FIG. 7C illustrates an experiment which resulted in an $ICP_{3,r}$ that was near a desired distance from the patternable area edge 450. As illustrated in FIGS. 7A-C when the interference fringes are measured for partial fields the interference fringes form only a part of an ellipse. Estimating the center of the ellipse may include fitting an ellipse to only a portion of the ellipse. FIGS. 7A-C also show imprint field edge and the template mesa edges. An offset between the template mesa edge relative to the imprint field edge at initial contact, as illustrated in FIG. 7A, is useful information for estimating the performance of the partial field imprint. These experiments are performed for a plurality of partial fields at numerous azimuthal coordinates and numerous partial field areas with numerous control conditions in which an ICP is measured to generate the superset of calibration data $\mathbb{C}$.

Adjusting Control Conditions

Before the first instance of adjusting the controlling condition S518 is performed an initial guess of the set of contact control values $V_0$ needs to be determined. The initial guess of the control conditions values $V_0$ maybe a default set of control conditions. The initial guess of the control conditions values $V_0$ may be selected from a list of initial guesses that are correlated with the partial field description F or just a component of the partial field description. The initial guess of the control conditions values $V_0$ may be interpolated between values in the list based on the partial field description for imprint field i and a list of the partial field descriptions F.

In the first instance of adjusting the controlling condition step S518, $V_0$ is compared to limitations on the control conditions. These control condition limitations can include ranges on each of the control conditions. These ranges may be to ensure safety and/or performance of the shaping system 100. These control value ranges may be a function of the partial field description or may be independent of the partial field description. For example, limitations on the tilt of the template may be a function of the partial field area and/or the mesa height and width of the template as described in Equation (1) above. The limitations on the pressure may be independent of the partial field description. In an embodiment, the limitations may be determined based on both the partial field description and information in the superset of calibration data $\mathbb{C}$. The adjusting the controlling condition step S518 will output an estimated set of contact control values $V_E$ that meets the limitations.

In subsequent instances the adjusting control conditions step S518 may including coming up with new values of the estimated set of contact control values $V_E$. These new values may be determined by incrementing one or more components of the estimated set of contact control values $V_E$. In an alternative embodiment, the initial guess of the set of contact control values $V_0$ may be arbitrary and the adjust control conditions step S518 is cycled through repeatedly until a suitable estimated $ICP_E$ is identified by the test step S522.

Estimate ICP

The ICP estimating step S520 may receive the estimated set of contact control values $V_E$ the adjusting control conditions step S518. The ICP estimating step S520 may then generate an estimated $ICP_E$ the estimated set of contact control values $V_E$. The ICP estimating step S520 may use an ICP model to generate an estimated $ICP_E$. The ICP model may make use of one or more equations that describe relationships between: estimated $ICP_E$; the estimated set of contact control values $V_E$; the partial field description $F_i$; a desired initial contact point $ICP_D$; and the superset of calibration data $\mathbb{C}$. Equation (2) below is an example of such a model. The ICP model includes an intercept parameter A and a vector of scaling parameters B.

$$ICP_E(F_i) = A(F_i) + B(F_i) \cdot V_E \qquad (2)$$

The applicant has found that the performance of the ICP model can be improved if the set of contact control values $V_E$ are replaced, adjusted, and/or reformulated to include only those parameters that have the greatest influence. The ICP estimating step S522 may include a reduction step S824 of converting the estimated set of contact control values $V_E$ into a reduced set of contact control values $V_R$. Equation (3) below is an example of an ICP model in which a reduced set of contact control values $V_R$ is used. As before, the ICP model includes an intercept parameter $A_R$ and a vector of scaling parameters $B_R$.

$$ICP_E(F_i) = A_R(F_i) + B_R(F_i) \cdot V_{R,E} \qquad (3)$$

The template tilt $\theta_{i,T}$ may be described in terms of two control angles $\{\theta_{i,Tx}, \theta_{i,Ty}\}$. The applicant has found that a single tilt parameter $\theta_{R,T}$ may be used to characterize the influence of template tilt on the ICP this single parameter may be predicted based on a single value which may be determined based on the azimuthal angle of the partial field $(F_{i,\theta})$. For example, Equation (4) below describes once such relationship.

$$\theta_{R,T} = \begin{cases} \theta_{i,Tx}, & 0° \geq F_{i,\theta} \geq 45° \\ \theta_{i,Ty}, & 45° > F_{i,\theta} \geq 90° \end{cases} \qquad (4)$$

Figure 8A:
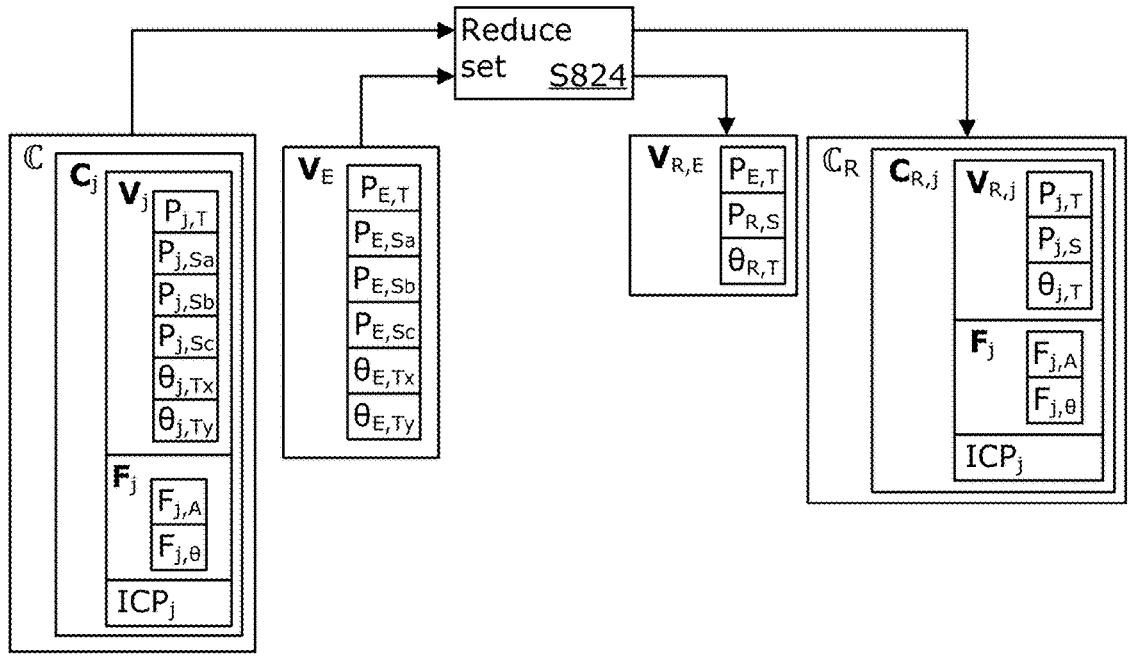
FIGS. 8A-B are flowcharts illustrating a method of determining ICP for small partial fields as used in an embodiment.
Figure 8B:
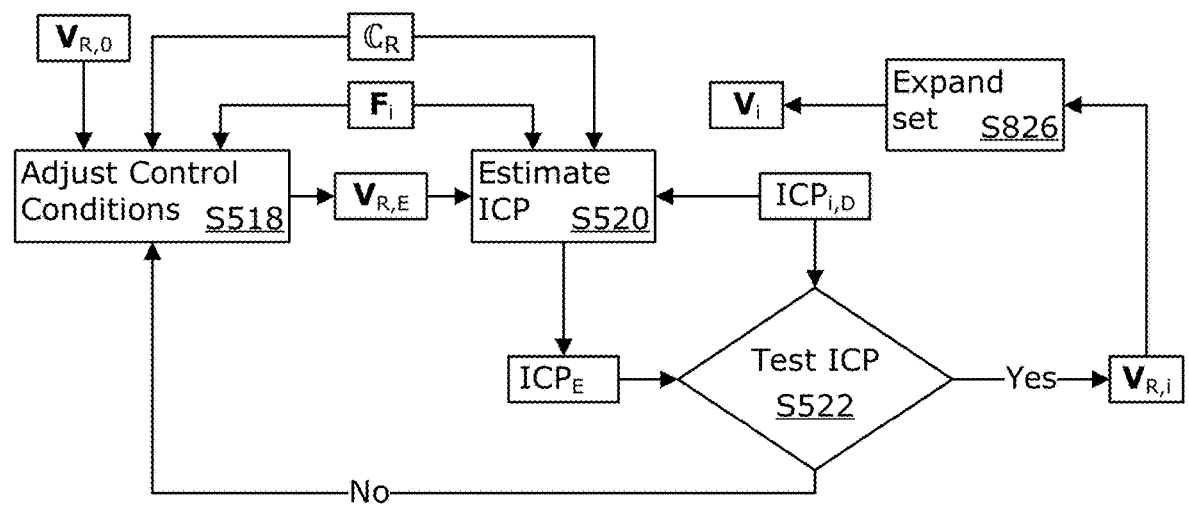

The applicant has also found that the control values used by the substrate chuck to adjust the shape of the substrate may be reduced to a single pressure parameter ($P_{R,S}$). In an embodiment, the $P_{Sa} = P_{Sb}$ are both set to a default value (which may be the highest setting of that zone of the vacuum chuck for example −50 kPa) and only the pressure $P_{Sb}$ in the first inner zone 604b is adjusted. In a similar manner the reduction step S824 may also be used to form a reduced superset of calibration data $\mathbb{C}_R$ by reducing each of the set of contact control values $V_j$ to a reduced set of contact control values $V_{R,j}$. In an alternative embodiment, the reduction set S824 is not performed and instead a reduced set of contact control values is used throughout an alternative ICP estimating method S520R is illustrated in FIG. 8B. The alternative ICP estimating method S520R is identical to ICP estimating method S520 and includes an expansion step S826 that is used to convert a reduced set of contact control values $V_R$,i into a final set of contact control values $V_i$. The expansion step S826 may include: determining $\theta_{Tx}$ and $\theta_{Ty}$ based on $\theta_{R,T}$ as shown in equations (5) below and the quadrant as represented by $\theta_{i,m}$ and setting some of the substrate back pressures to a default value. In an alternative embodiment, the ICP model is non-linear model and/or makes use of other modeling techniques such as state-vector regression, neural networks, etc.

$$\theta_{i,Tx} = \begin{cases} \theta_{R,T} sig(\cos(\theta_{i,m})), & \cos(\theta_{i,m}) > \sin(\theta_{i,m}) \\ \dfrac{\theta_{i,Ty}}{\tan(\theta_{i,m}) \, sig(\sin(\theta_{i,m}))}, & \cos(\theta_{i,m}) \leq \sin(\theta_{i,m}) \end{cases} \qquad (5)$$

$$\theta_{i,Ty} = \begin{cases} \theta_{i,Tx} \tan(\theta_{i,m}) \, sig(\sin(\theta_{i,m})), & \cos(\theta_{i,m}) > \sin(\theta_{i,m}) \\ \theta_{R,T} sig(\sin(\theta_{i,m})), & \cos(\theta_{i,m}) \leq \sin(\theta_{i,m}) \end{cases}$$

The parameters of the ICP model are defined over a discrete uniform range of partial field description can be determined using the superset of calibration data $\mathbb{C}$ across a uniform grid in the partial field space. An example of such a uniform grid of ordered pairs of partial field descriptors is: {5%, 0°; 5%, 10°; 5%, 20°; 5%, 30°; 5%, 40°; 5%, 50°; 5%, 60°; 5%, 70°; 5%, 80°; 5%, 90°; 10%, 0°; 10%, 10°; 10%, 20°; 10%, 30°; 10%, 40°; 10%, 50°; 10%, 60°; 10%, 70°; 10%, 80°; 10%, 90°; 15%, 0°; 15%, 10°; 15%, 20°; 15%, 30°; 15%, 40°; 15%, 50°; 15%, 60°; 15%, 70°; 15%, 80°; 15%, 90°; 20%, 0°; 20%, 10°; 20%, 20°; 20%, 30°; 20%, 40°; 20%, 50°; 20%, 60°; 20%, 70°; 20%, 80°; 20%, 90°; 25%, 0°; 25%, 10°; 25%, 20°; 25%, 30°; 25%, 40°; 25%, 50°; 25%, 60°; 25%, 70°; 25%, 80°; 25%, 90°}. This set of ordered pairs are on a grid with an azimuthal grid spacing ($\Delta\theta$) of 10° and a partial field area grid spacing ($\Delta A$) of 5% in the partial field coordinate space. The ICP model parameters are determined at each of these points on the grid in the partial field coordinate space. In other words, if there are M grid points in the partial field space there will be M ICP equations each with different parameters in the partial field space.

Determining the parameters of the ICP model can mean segmenting the superset of calibration data $\mathbb{C}$ or the reduced superset of calibration data $\mathbb{C}_R$ into multiple subsets ($\mathbb{C}_{R,A,\theta}$; $\mathbb{C}_{A,\theta}$) one subset for each grid point $\{F_A, F_\theta\}$ in the partial field space. Each subset of the superset is then used to determine to determine model ICP model parameters for that grid point $\{F_A, F_\theta\}$. This may be done using least squares fitting or other known statistical techniques for fitting data to a model.

Figure 9A:
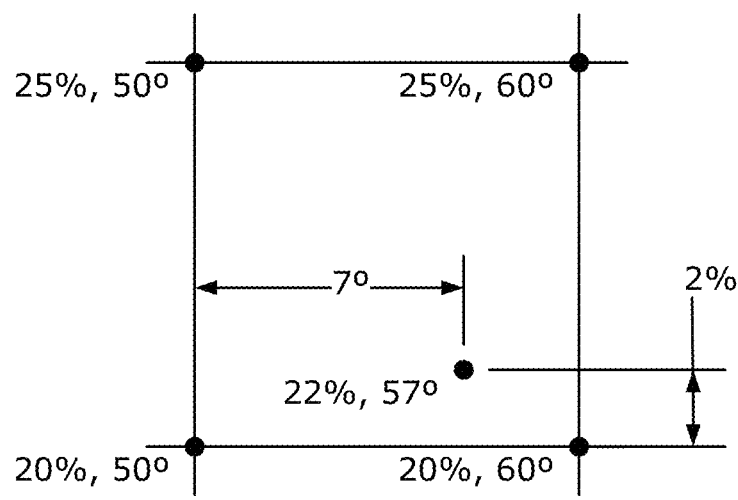
FIGS. 9A-B illustrate a grid in the partial field space as used in an embodiment.
Figure 9B:
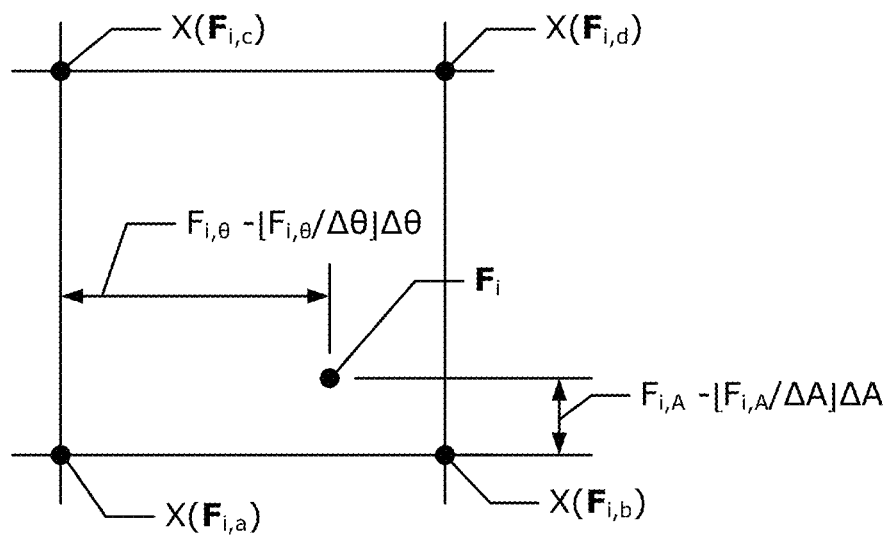

Once the parameters of the ICP model are known across grid points in the ICP model space, the next step is determining the ICP model parameters in at coordinate points that are not on the partial field grid points as illustrated in a specific example in FIG. 9A. FIG. 9A is an illustration of a specific portion of a grid in the partial field description space with a specific partial field description. At each grid point in this space values of $A_R(F)$ and $B_R(F)$ (or $A(F)$ and $B(F)$) are known which is represented by a general variable $X(F)$. In general, $F_i$ is not on the grid and the value of $X(F_i)$ is determined using bilinear interpolation of the nearest grid points. The nearest grid points are described in equation (6) these grid points are used determine a value of $X(F_i)$ using bilinear interpolation. FIG. 9B is a more general illustration showing these grid points. Other well known methods such as polynomial fit, weighted mean, etc. may be used to determine $X(F_i)$ given the values X in a partial field space. In an alternative method a global solution for X is determined across the partial field coordinated space.

$$F_i = \{F_{i,A}\ F_{i,\theta}\} \quad (6)$$

$$F_{i,a} = \left\{\left\lfloor\frac{F_{i,A}}{\Delta A}\right\rfloor \Delta A, \left\lfloor\frac{F_{i,\theta}}{\Delta\theta}\right\rfloor \Delta\theta\right\}$$

$$F_{i,b} = \left\{\left\lceil\frac{F_{i,A}}{\Delta A}\right\rceil \Delta A, \left\lfloor\frac{F_{i,\theta}}{\Delta\theta}\right\rfloor \Delta\theta\right\}$$

$$F_{i,c} = \left\{\left\lfloor\frac{F_{i,A}}{\Delta A}\right\rfloor \Delta A, \left\lceil\frac{F_{i,\theta}}{\Delta\theta}\right\rceil \Delta\theta\right\}$$

$$F_{i,d} = \left\{\left\lceil\frac{F_{i,A}}{\Delta A}\right\rceil \Delta A, \left\lceil\frac{F_{i,\theta}}{\Delta\theta}\right\rceil \Delta\theta\right\}$$

Once the ICP model parameters are determined for the partial field location $F_i$ the ICP model can be used to estimate the ICP for the partial field $F_i$. In an embodiment, the superset of calibration data $\mathbb{C}$ and the ICP model are only defined for one quadrant of the substrate. In an embodiment, if the partial field description is adjusted for example as described in equation (7) below so that azimuthal partial field descriptions from all four quadrants are mapped onto one of the quadrants.

$$F_{i,\theta} = \begin{cases} F_{i,\theta}, & 0° \leq F_{i,\theta} \leq 90° \\ 180° - F_{i,\theta}, & 90° < F_{i,\theta} \leq 180° \\ F_{i,\theta} - 180°, & 180° < F_{i,\theta} \leq 270° \\ 360° - F_{i,\theta}, & 270° < F_{i,\theta} \leq 360 \end{cases} \quad (7)$$

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of imprinting a partial field comprising:
   determining a set of initial contact control values using an initial contact point model for predicting a potential initial contact point based on:
   a superset of calibration data;
   a desired initial contact point; and
   a partial field shape description;
   wherein the initial contact point model is one of:
   a linear regression for predicting the potential initial contact point based on potential initial contact control values;
   a state-vector regression for predicting the potential initial contact point based on potential initial contact control values; and
   a neural network regression for predicting the potential initial contact point based on potential initial contact control values; and
   imprinting the partial field with the set of initial contact control values.

2. The method of claim 1 wherein the set of initial contact control values comprises:
   a template cavity pressure applied to a portion of a template during initial contact of the template with formable material on a substrate;
   a substrate pressure applied to a portion of the substrate during initial contact of the template with formable material on the substrate; and
   a tilt of the template relative to the substrate during initial contact of the template with formable material on the substrate.

3. The method of claim 1, each element of the superset of calibration data is a set that includes:
   a test set of initial contact control values;
   a measured initial contact point; and
   a test partial field shape description.

4. The method of claim 1, further comprising:
   generating the calibration data, wherein generating the calibration data comprises:
   imprinting a plurality of test partial fields each test partial field among the plurality of partial fields having:
   a measured initial contact point of the each test partial field;
   a test partial field shape description; and the set of initial contact control values of the each test partial field.

5. The method of claim 4, further comprising:
receiving an image of a template initially contacting formable material on a substrate;
measuring interference fringes in the image; and
estimating a center of the interference fringes as the measured initial contact point.

6. The method of claim 1, wherein the partial field shape description comprises:
an azimuthal position of the partial field; and
an area of the partial field.

7. The method of claim 6, wherein the partial field shape description further comprises a partial field category that is based on a shape of the partial field.

8. The method of claim 1, wherein the determining of the set of initial contact control values comprises:
identifying a subset of the superset of calibration data that surround the partial field shape description and the desired initial contact point;
selecting a first potential set of initial contact control values within a control value range defined by the subset of the superset of calibration data; and
predicting the potential initial contact point using the initial contact point model and the first potential set of initial contact control values.

9. The method of claim 8, wherein the determining of the set of initial contact control values further comprises:
estimating a first potential contact point difference between the potential initial contact point and the desired initial contact point; and
setting the first potential set of initial control values as the set of initial contact control values in a case wherein the first potential contact point difference in within a contact threshold.

10. The method of claim 9, wherein the determining of the set of initial contact control values further comprises:
recursively selecting a new potential set of initial contact control values within the control value range defined by the subset of the superset of calibration data;
recursively predicting a new potential initial contact point using the initial contact point model and the new potential set of initial contact control values;
recursively estimating a new potential contact point difference between the new potential initial contact point and the desired initial contact point;
wherein the recursively selecting, recursively predicting, and recursively estimating are recursively performed until the new potential contact point difference is within the contact threshold; and
setting the new potential set of initial control values as the set of initial contact control values once the first potential contact point difference in within the contact threshold.

11. The method of claim 1, wherein the determining of the set of initial contact control values comprises:
identifying a subset of the superset of calibration data that surround the partial field shape description and the desired initial contact point;
selecting a plurality of potential sets of initial contact control values within a control value range defined by the subset of the superset of calibration data;
predicting a plurality of potential initial contact points using the initial contact point model and the plurality of potential sets of initial contact control values;
estimating a plurality of potential contact point differences between the plurality of potential initial contact points and the desired initial contact point;
selecting a potential contact point difference from among the plurality of potential contact point differences that has a smallest absolute value; and
setting the first potential set of initial control values as the set of initial contact control values.

12. The method of claim 1, wherein the partial field shape description includes an area of the partial field that is less than 30% of a full field area.

13. A method of shaping a film on a substrate in a plurality of fields, wherein a subset of fields among the plurality of fields that are categorized as the partial field are shaped using the method of claim 1, wherein the method further comprises:
adjusting, after the initial contact, the control conditions so that the template contacts all of the formable material in the particular field with the template;
exposing the formable material under the template to actinic radiation after the template and the substrate are substantially parallel to each other; and
separating the template from the formable material.

14. A method of manufacturing an article, from a substrate on which a film was shaped according to the method of claim 13, further comprising:
processing the substrate; and
forming the article from the processed substrate.

15. A system comprising:
one or more memory; and
one or more processors configured to:
determine a set of initial contact control values using an initial contact point model for predicting a potential initial contact point based on:
a superset of calibration data;
a desired initial contact point; and
a partial field shape description;
wherein the initial contact point model is one of:
a linear regression for predicting the potential initial contact point based on potential initial contact control values;
a state-vector regression for predicting the potential initial contact point based on potential initial contact control values; and
a neural network regression for predicting the potential initial contact point based on potential initial contact control values; and
send instructions for a shaping system to contact the formable material in the partial field with the set of initial contact control values.

16. The system of claim 15, further comprising:
a template chuck configured to apply a pressure to a back surface of the template which bows out the template; and
wherein the set of initial contact control values include the pressure.

17. The system of claim 15, further comprising:
a plurality of actuators configured to adjust a tilt of the template relative to the substrate; and
wherein the set of initial contact control values include the tilt.

18. The system of claim 15, further comprising:
a substrate chuck configured to deform a shape of the substrate; and wherein the set of initial contact control values a set of control values supplied to the substrate chuck.

* * * * *